United States Patent
Long et al.

(10) Patent No.: US 11,378,997 B2
(45) Date of Patent: Jul. 5, 2022

(54) VARIABLE PHASE AND FREQUENCY PULSE-WIDTH MODULATION TECHNIQUE

(71) Applicant: ULTRAHAPTICS IP LTD, Bristol (GB)

(72) Inventors: Benjamin John Oliver Long, Bristol (GB); Rafel Jibry, Bristol (GB)

(73) Assignee: ULTRAHAPTICS IP LTD, Bristol (GB)

( * ) Notice: Subject to any disclaimer, the term of this patent is extended or adjusted under 35 U.S.C. 154(b) by 81 days.

(21) Appl. No.: 16/600,496

(22) Filed: Oct. 12, 2019

(65) Prior Publication Data
US 2020/0117229 A1  Apr. 16, 2020

Related U.S. Application Data

(60) Provisional application No. 62/744,656, filed on Oct. 12, 2018.

(51) Int. Cl.
*G06F 1/025* (2006.01)
*G06F 17/17* (2006.01)

(52) U.S. Cl.
CPC ............. *G06F 1/025* (2013.01); *G06F 17/17* (2013.01)

(58) Field of Classification Search
CPC .................................. G06F 17/17; G06F 1/025
USPC ........................................................ 708/271
See application file for complete search history.

(56) References Cited

U.S. PATENT DOCUMENTS

| | | | |
|---|---|---|---|
| 4,218,921 A | 8/1980 | Berge | |
| 4,771,205 A | 9/1988 | Mequio | |
| 4,881,212 A | 11/1989 | Takeuchi | |
| 5,226,000 A | 7/1993 | Moses | |
| 5,243,344 A * | 9/1993 | Kouloupoulos | ........ H03M 3/392 341/131 |
| 5,329,682 A | 7/1994 | Thurn | |
| 5,422,431 A | 6/1995 | Ichiki | |
| 5,426,388 A | 6/1995 | Flora | |
| 5,477,736 A | 12/1995 | Lorraine | |
| 5,511,296 A | 4/1996 | Dias | |

(Continued)

FOREIGN PATENT DOCUMENTS

| | | |
|---|---|---|
| CA | 2470115 A1 | 6/2003 |
| CN | 101986787 | 3/2011 |

(Continued)

OTHER PUBLICATIONS

E.S. Ebbini et al. (1991), A spherical-section ultrasound phased array applicator for deep localized hyperthermia, Biomedical Engineering, IEEE Transactions on (vol. 38 Issue: 7), pp. 634-643.

(Continued)

*Primary Examiner* — Tan V Mai
(74) *Attorney, Agent, or Firm* — Koffsky Schwalb LLC; Mark I. Koffsky

(57) ABSTRACT

Phased array systems rely on the production of an exact carrier frequency to function. Reconstructing digital signals by specified amplitude and phase is accomplished explicitly by inducing frequency shifts away from a base frequency implied by phase changes. Shifting the carrier frequency of a digitally controlled phased array while preserving the timing of the individual phase pulses enables more efficient driving of the phased array system when the phase of the drive signals change dynamically in time.

12 Claims, 9 Drawing Sheets

(56) References Cited

U.S. PATENT DOCUMENTS

| | | |
|---|---|---|
| 5,859,915 A | 1/1999 | Norris |
| 6,029,518 A | 2/2000 | Oeftering |
| 6,193,936 B1 | 2/2001 | Gardner |
| 6,503,204 B1 | 1/2003 | Sumanaweera |
| 6,647,359 B1 | 11/2003 | Verplank |
| 6,771,294 B1 | 8/2004 | Pulli |
| 6,772,490 B2 | 8/2004 | Toda |
| 6,800,987 B2 | 10/2004 | Toda |
| 7,107,159 B2 | 9/2006 | German |
| 7,109,789 B2 | 9/2006 | Spencer |
| 7,182,726 B2 | 2/2007 | Williams |
| 7,225,404 B1 | 5/2007 | Zilles |
| 7,345,600 B1 | 3/2008 | Fedigan |
| 7,487,662 B2 | 2/2009 | Schabron |
| 7,577,260 B1 | 8/2009 | Hooley |
| 7,692,661 B2 | 4/2010 | Cook |
| RE42,192 E | 3/2011 | Schabron |
| 7,966,134 B2 | 6/2011 | German |
| 8,000,481 B2 | 8/2011 | Nishikawa |
| 8,123,502 B2 | 2/2012 | Blakey |
| 8,269,168 B1 | 9/2012 | Axelrod |
| 8,279,193 B1 | 10/2012 | Birnbaum |
| 8,369,973 B2 | 2/2013 | Risbo |
| 8,607,922 B1 | 12/2013 | Werner |
| 8,833,510 B2 | 9/2014 | Koh |
| 8,884,927 B1 | 11/2014 | Cheatham, III |
| 9,208,664 B1 | 12/2015 | Peters |
| 9,267,735 B2 | 2/2016 | Funayama |
| 9,421,291 B2 | 8/2016 | Robert |
| 9,612,658 B2 | 4/2017 | Subramanian |
| 9,662,680 B2 | 5/2017 | Yamamoto |
| 9,816,757 B1 | 11/2017 | Zielinski |
| 9,841,819 B2 | 12/2017 | Carter |
| 9,863,699 B2 | 1/2018 | Corbin, III |
| 9,898,089 B2 | 2/2018 | Subramanian |
| 9,945,818 B2 | 4/2018 | Ganti |
| 9,977,120 B2 | 5/2018 | Carter |
| 10,101,811 B2 | 10/2018 | Carter |
| 10,101,814 B2 | 10/2018 | Carter |
| 10,133,353 B2 | 11/2018 | Eid |
| 10,140,776 B2 | 11/2018 | Schwarz |
| 10,146,353 B1 | 12/2018 | Smith |
| 10,469,973 B2 | 11/2019 | Hayashi |
| 10,510,357 B2 * | 12/2019 | Kovesi ............. G10L 19/0204 |
| 10,523,159 B2 | 12/2019 | Megretski |
| 10,569,300 B2 | 2/2020 | Hoshi |
| 2001/0033124 A1 | 10/2001 | Norris |
| 2002/0149570 A1 | 10/2002 | Knowles |
| 2003/0024317 A1 | 2/2003 | Miller |
| 2003/0144032 A1 | 7/2003 | Brunner |
| 2003/0182647 A1 | 9/2003 | Radeskog |
| 2004/0005715 A1 | 1/2004 | Schabron |
| 2004/0014434 A1 | 1/2004 | Haardt |
| 2004/0052387 A1 | 3/2004 | Norris |
| 2004/0091119 A1 | 5/2004 | Duraiswami |
| 2004/0210158 A1 | 10/2004 | Organ |
| 2004/0226378 A1 | 11/2004 | Oda |
| 2004/0264707 A1 | 12/2004 | Yang |
| 2005/0052714 A1 | 3/2005 | Klug |
| 2005/0056851 A1 | 3/2005 | Althaus |
| 2005/0212760 A1 | 9/2005 | Marvit |
| 2005/0267695 A1 | 12/2005 | German |
| 2006/0085049 A1 | 4/2006 | Cory |
| 2006/0090955 A1 | 5/2006 | Cardas |
| 2006/0091301 A1 | 5/2006 | Trisnadi |
| 2006/0164428 A1 | 7/2006 | Cook |
| 2007/0036492 A1 | 2/2007 | Lee |
| 2007/0094317 A1 * | 4/2007 | Wang ............... H03H 17/028 708/290 |
| 2007/0177681 A1 | 8/2007 | Choi |
| 2007/0263741 A1 | 11/2007 | Erving |
| 2008/0012647 A1 | 1/2008 | Risbo |
| 2008/0084789 A1 | 4/2008 | Altman |
| 2008/0130906 A1 | 6/2008 | Goldstein |
| 2008/0273723 A1 | 11/2008 | Hartung |
| 2008/0300055 A1 | 12/2008 | Lutnick |
| 2009/0093724 A1 | 4/2009 | Pernot |
| 2009/0116660 A1 | 5/2009 | Croft, III |
| 2009/0232684 A1 | 9/2009 | Hirata |
| 2009/0251421 A1 | 10/2009 | Bloebaum |
| 2009/0319065 A1 | 12/2009 | Risbo |
| 2010/0013613 A1 | 1/2010 | Weston |
| 2010/0030076 A1 | 2/2010 | Vortman |
| 2010/0044120 A1 | 2/2010 | Richter |
| 2010/0066512 A1 | 3/2010 | Rank |
| 2010/0085168 A1 | 4/2010 | Kyung |
| 2010/0103246 A1 | 4/2010 | Schwerdtner |
| 2010/0109481 A1 | 5/2010 | Buccafusca |
| 2010/0199232 A1 | 8/2010 | Mistry |
| 2010/0231508 A1 | 9/2010 | Cruz-Hernandez |
| 2010/0262008 A1 | 10/2010 | Roundhill |
| 2010/0302015 A1 | 12/2010 | Kipman |
| 2010/0321216 A1 | 12/2010 | Jonsson |
| 2011/0006888 A1 | 1/2011 | Bae |
| 2011/0010958 A1 | 1/2011 | Clark |
| 2011/0051554 A1 | 3/2011 | Varray |
| 2011/0066032 A1 | 3/2011 | Vitek |
| 2011/0199342 A1 | 8/2011 | Vartanian |
| 2011/0310028 A1 | 12/2011 | Camp, Jr. |
| 2012/0057733 A1 | 3/2012 | Morii |
| 2012/0063628 A1 | 3/2012 | Rizzello |
| 2012/0066280 A1 | 3/2012 | Tsutsui |
| 2012/0223880 A1 | 9/2012 | Birnbaum |
| 2012/0229400 A1 | 9/2012 | Birnbaum |
| 2012/0229401 A1 | 9/2012 | Birnbaum |
| 2012/0236689 A1 | 9/2012 | Brown |
| 2012/0243374 A1 | 9/2012 | Dahl |
| 2012/0249409 A1 | 10/2012 | Toney |
| 2012/0249474 A1 | 10/2012 | Pratt |
| 2012/0299853 A1 | 11/2012 | Dagar |
| 2012/0307649 A1 | 12/2012 | Park |
| 2012/0315605 A1 | 12/2012 | Cho |
| 2013/0035582 A1 | 2/2013 | Radulescu |
| 2013/0079621 A1 | 3/2013 | Shoham |
| 2013/0094678 A1 | 4/2013 | Scholte |
| 2013/0100008 A1 | 4/2013 | Marti |
| 2013/0101141 A1 | 4/2013 | McElveen |
| 2013/0173658 A1 | 7/2013 | Adelman |
| 2014/0027201 A1 | 1/2014 | Islam |
| 2014/0104274 A1 | 4/2014 | Hilliges |
| 2014/0139071 A1 | 5/2014 | Yamamoto |
| 2014/0168091 A1 | 6/2014 | Jones |
| 2014/0204002 A1 | 7/2014 | Bennet |
| 2014/0265572 A1 | 9/2014 | Siedenburg |
| 2014/0269207 A1 | 9/2014 | Baym |
| 2014/0269208 A1 | 9/2014 | Baym |
| 2015/0002477 A1 | 1/2015 | Cheatham, III |
| 2015/0005039 A1 | 1/2015 | Liu |
| 2015/0006645 A1 | 1/2015 | Oh |
| 2015/0007025 A1 | 1/2015 | Sassi |
| 2015/0013023 A1 | 1/2015 | Wang |
| 2015/0066445 A1 | 3/2015 | Lin |
| 2015/0070147 A1 | 3/2015 | Cruz-Hernandez |
| 2015/0070245 A1 | 3/2015 | Han |
| 2015/0078136 A1 | 3/2015 | Sun |
| 2015/0081110 A1 | 3/2015 | Houston |
| 2015/0110310 A1 | 4/2015 | Minnaar |
| 2015/0130323 A1 | 5/2015 | Harris |
| 2015/0168205 A1 | 6/2015 | Lee |
| 2015/0192995 A1 | 7/2015 | Subramanian |
| 2015/0220199 A1 | 8/2015 | Wang |
| 2015/0226537 A1 | 8/2015 | Schorre |
| 2015/0226831 A1 | 8/2015 | Nakamura |
| 2015/0248787 A1 | 9/2015 | Abovitz |
| 2015/0258431 A1 | 9/2015 | Stafford |
| 2015/0277610 A1 | 10/2015 | Kim |
| 2015/0304789 A1 | 10/2015 | Babayoff |
| 2015/0323667 A1 | 11/2015 | Przybyla |
| 2015/0331576 A1 | 11/2015 | Piya |
| 2015/0332075 A1 | 11/2015 | Burch |
| 2016/0019762 A1 | 1/2016 | Levesque |
| 2016/0019879 A1 | 1/2016 | Daley |
| 2016/0026253 A1 | 1/2016 | Bradski |
| 2016/0044417 A1 | 2/2016 | Clemen, Jr. |

(56) References Cited

U.S. PATENT DOCUMENTS

| | | |
|---|---|---|
| 2016/0124080 A1 | 5/2016 | Carter |
| 2016/0138986 A1 | 5/2016 | Carlin |
| 2016/0175701 A1 | 6/2016 | Froy |
| 2016/0175709 A1 | 6/2016 | Idris |
| 2016/0189702 A1 | 6/2016 | Blanc |
| 2016/0242724 A1 | 8/2016 | Lavallee |
| 2016/0246374 A1 | 8/2016 | Carter |
| 2016/0249150 A1 | 8/2016 | Carter |
| 2016/0291716 A1 | 10/2016 | Boser |
| 2016/0306423 A1 | 10/2016 | Uttermann |
| 2016/0320843 A1 | 11/2016 | Long |
| 2016/0339132 A1 | 11/2016 | Cosman |
| 2016/0374562 A1 | 12/2016 | Vertikov |
| 2017/0002839 A1 | 1/2017 | Bukland |
| 2017/0004819 A1 | 1/2017 | Ochiai |
| 2017/0018171 A1 | 1/2017 | Carter |
| 2017/0052148 A1 | 2/2017 | Estevez |
| 2017/0123487 A1 | 5/2017 | Hazra |
| 2017/0123499 A1 | 5/2017 | Eid |
| 2017/0140552 A1 | 5/2017 | Woo |
| 2017/0144190 A1 | 5/2017 | Hoshi |
| 2017/0181725 A1 | 6/2017 | Han |
| 2017/0193768 A1 | 7/2017 | Long |
| 2017/0193823 A1 | 7/2017 | Jiang |
| 2017/0211022 A1 | 7/2017 | Reinke |
| 2017/0336860 A1 | 11/2017 | Smoot |
| 2018/0039333 A1 | 2/2018 | Carter |
| 2018/0074580 A1 | 3/2018 | Hardee |
| 2018/0081439 A1 | 3/2018 | Daniels |
| 2018/0139557 A1 | 5/2018 | Ochiai |
| 2018/0146306 A1 | 5/2018 | Benattar |
| 2018/0151035 A1 | 5/2018 | Maalouf |
| 2018/0166063 A1 | 6/2018 | Long |
| 2018/0190007 A1 | 7/2018 | Panteleev |
| 2018/0304310 A1 | 10/2018 | Long |
| 2018/0309515 A1 | 10/2018 | Murakowski |
| 2018/0310111 A1 | 10/2018 | Kappus |
| 2018/0350339 A1 | 12/2018 | Macours |
| 2018/0361174 A1 | 12/2018 | Radulescu |
| 2019/0038496 A1 | 2/2019 | Levesque |
| 2019/0091565 A1 | 3/2019 | Nelson |
| 2019/0175077 A1 | 6/2019 | Zhang |
| 2019/0187244 A1 | 6/2019 | Riccardi |
| 2019/0196578 A1 | 6/2019 | Iodice |
| 2019/0197840 A1 | 6/2019 | Kappus |
| 2019/0197842 A1 | 6/2019 | Long |
| 2019/0235628 A1 | 8/2019 | Lacroix |
| 2020/0080776 A1 | 3/2020 | Kappus |

FOREIGN PATENT DOCUMENTS

| | | |
|---|---|---|
| CN | 102459900 | 5/2012 |
| CN | 102591512 | 7/2012 |
| CN | 103797379 | 5/2014 |
| CN | 103984414 A | 8/2014 |
| CN | 107340871 A | 11/2017 |
| EP | 309003 | 3/1989 |
| EP | 1875081 A1 | 1/2008 |
| EP | 1911530 | 4/2008 |
| EP | 2271129 A1 | 1/2011 |
| EP | 1461598 B1 | 4/2014 |
| EP | 3207817 A1 | 8/2017 |
| GB | 2464117 | 4/2010 |
| GB | 2513884 | 11/2014 |
| GB | 2513884 A | 11/2014 |
| GB | 2530036 | 3/2016 |
| JP | 2008074075 | 4/2008 |
| JP | 2010109579 | 5/2010 |
| JP | 2011172074 | 9/2011 |
| JP | 2012048378 | 3/2012 |
| JP | 2015035657 A | 2/2015 |
| JP | 2016035646 | 3/2016 |
| KR | 20120065779 | 6/2012 |
| KR | 20130055972 | 5/2013 |
| KR | 20160008280 | 1/2016 |
| WO | 9118486 | 11/1991 |
| WO | 9639754 | 12/1996 |
| WO | 03050511 A | 6/2003 |
| WO | 2005017965 | 2/2005 |
| WO | 2007144801 A2 | 12/2007 |
| WO | 2009071746 A1 | 6/2009 |
| WO | 2009112866 | 9/2009 |
| WO | 2010003836 | 1/2010 |
| WO | 2010139916 | 12/2010 |
| WO | 2011132012 A1 | 10/2011 |
| WO | 2012023864 | 2/2012 |
| WO | 2012104648 A1 | 8/2012 |
| WO | 2013179179 | 12/2013 |
| WO | 2014181084 | 11/2014 |
| WO | 2014181084 A1 | 11/2014 |
| WO | 2015006467 | 1/2015 |
| WO | 2015039622 | 3/2015 |
| WO | 2015127335 | 8/2015 |
| WO | 2016007920 | 1/2016 |
| WO | 2016095033 A1 | 6/2016 |
| WO | 2016099279 | 6/2016 |
| WO | 2016132144 | 8/2016 |
| WO | 2016137675 | 9/2016 |
| WO | 2016162058 | 10/2016 |
| WO | 2017172006 | 10/2017 |
| WO | 2020049321 A2 | 3/2020 |

OTHER PUBLICATIONS

Gavrilov, L.R. (2008) "The Possibility of Generating Focal Regions of Complex Configurations in Application to the Problems of Stimulation of Human Receptor Structures by Focused Ultrasound" Acoustical Physics, vol. 54, No. 2, pp. 269-278.

Mingzhu Lu et al. (2006) Design and experiment of 256-element ultrasound phased array for noninvasive focused ultrasound surgery, Ultrasonics, vol. 44, Supplement, Dec. 22, 2006, pp. e325-e330.

Gavrilov L R et al. (2000) "A theoretical assessment of the relative performance of spherical phased arrays for ultrasound surgery" Ultrasonics, Ferroelectrics, and Frequency Control, IEEE Transactions on (vol. 47, Issue: 1), pp. 125-139.

Pompei, F.J. (2002), "Sound from Ultrasound: The Parametric Array as an Audible Sound Source", Massachusetts Institute of Technology (132 pages).

Hasegawa, K. and Shinoda, H. (2013) "Aerial Display of Vibrotactile Sensation with High Spatial-Temporal Resolution using Large Aperture Airbourne Ultrasound Phased Array", University of Tokyo (6 pages).

Hoshi T et al., "Noncontact Tactile Display Based on Radiation Pressure of Airborne Ultrasound", IEEE Transactions on Haptics, IEEE, USA, (Jul. 1, 2010), vol. 3, No. 3, ISSN 1939-1412, pp. 155-165.

Yoshino, K. and Shinoda, H. (2013), "Visio Acoustic Screen for Contactless Touch Interface with Tactile Sensation", University of Tokyo (5 pages).

Kamakura, T. and Aoki, K. (2006) "A Highly Directional Audio System using a Parametric Array in Air" WESPAC IX 2006 (8 pages).

Alexander, J. et al. (2011), Adding Haptic Feedback to Mobile TV (6 pages).

Tom Carter et al, "UltraHaptics: Multi-Point Mid-Air Haptic Feedback for Touch Surfaces", Proceedings of the 26th Annual ACM Symposium on User Interface Software and Technology, UIST '13, New York, New York, USA, (Jan. 1, 2013), ISBN 978-1-45-032268-3, pp. 505-514.

Search Report for GB1308274.8 dated Nov. 11, 2013. (2 pages).

Iwamoto T et al, "Two-dimensional Scanning Tactile Display using Ultrasound Radiation Pressure", Haptic Interfaces for Virtual Environment and Teleoperator Systems, 20 06 14th Symposium on Alexandria, VA, USA Mar. 25-26, 2006, Piscataway, NJ, USA,IEEE, (Mar. 25, 2006), ISBN 978-1-4244-0226-7, pp. 57-61.

Iwamoto et al. (2008), Non-contact Method for Producing Tactile Sensation Using Airborne Ultrasound, EuroHaptics, pp. 504-513.

Search report for PCT/GB2015/052578 dated Oct. 26, 2015 (12 pages).

(56) References Cited

OTHER PUBLICATIONS

Marzo et al., Holographic acoustic elements for manipulation of levitated objects, Nature Communications DOI: I0.1038/ncomms9661 (2015) (7 pages).
Search report for PCT/GB2014/051319 dated Dec. 8, 2014 (4 pages).
Search Report for GB1415923.0 dated Mar. 11, 2015. (1 page).
Marshall, M., Carter, T., Alexander, J., & Subramanian, S. (2012). Ultratangibles: creating movable tangible objects on interactive tables. In Proceedings of the 2012 ACM annual conference on Human Factors in Computing Systems, (pp. 2185-2188).
Obrist et al., Talking about Tactile Experiences, CHI 2013, Apr. 27-May 2, 2013 (10 pages).
Benjamin Long et al, "Rendering volumetric haptic shapes in mid-air using ultrasound", ACM Transactions On Graphics (TOG), ACM, US, (Nov. 19, 2014), vol. 33, No. 6, ISSN 0730-0301, pp. 1-10.
Freeman et al., Tactile Feedback for Above-Device Gesture Interfaces: Adding Touch to Touchless Interactions ICMI'14, Nov. 12-16, 2014, Istanbul, Turkey (8 pages).
Obrist et al., Emotions Mediated Through Mid-Air Haptics, CHI 2015, Apr. 18-23, 2015, Seoul, Republic of Korea. (10 pages).
Wilson et al., Perception of Ultrasonic Haptic Feedback on the Hand: Localisation and Apparent Motion, CHI 2014, Apr. 26-May 1, 2014, Toronto, Ontario, Canada. (10 pages).
Phys.org, Touchable Hologram Becomes Reality, Aug. 6, 2009, by Lisa Zyga (2 pages).
Iwamoto et al., Airborne Ultrasound Tactile Display: Supplement, The University of Tokyo 2008 (2 pages).
Hoshi, T., Development of Aerial-Input and Aerial-Tactile-Feedback System, IEEE World Haptics Conference 2011, p. 569-573.
EPSRC Grant summary EP/J004448/1 (2011) (1 page).
Hoshi, T., Handwriting Transmission System Using Noncontact Tactile Display, IEEE Haptics Symposium 2012 pp. 399-401.
Takahashi, M. et al., Large Aperture Airborne Ultrasound Tactile Display Using Distributed Array Units, SICE Annual Conference 2010 p. 359-62.
Hoshi, T., Non-contact Tactile Sensation Synthesized by Ultrasound Transducers, Third Joint Euro haptics Conference and Symposium on Haptic Interfaces for Virtual Environment and Teleoperator Systems 2009 (5 pages).
Tom Nelligan and Dan Kass, Intro to Ultrasonic Phased Array (date unknown) (8 pages).
Light, E.D., Progress in Two Dimensional Arrays for Real Time Volumetric Imaging, 1998 (17 pages).
Casper et al., Realtime Control of Multiple-focus Phased Array Heating Patterns Based on Noninvasive Ultrasound Thermography, IEEE Trans Biomed Eng. Jan. 2012; 59(1): 95-105.
Hoshi, T., Touchable Holography, Siggraph 2009, New Orleans, Louisiana, Aug. 3-7, 2009. (1 page).
Sylvia Gebhardt, Ultrasonic Transducer Arrays for Particle Manipulation (date unknown) (2 pages).
Search report and Written Opinion of ISA for PCT/GB2015/050417 dated Jul. 8, 2016 (20 pages).
Search report and Written Opinion of ISA for PCT/GB2015/050421 dated Jul. 8, 2016 (15 pages).
Search report and Written Opinion of ISA for PCT/GB2017/050012 dated Jun. 8, 2017. (18 pages).
Oscar Martínez-Graullera et al, "2D array design based on Fermat spiral for ultrasound imaging", Ultrasonics, (Feb. 1, 2010), vol. 50, No. 2, ISSN 0041-624X, pp. 280-289, XP055210119.
Search Report for PCT/GB2017/052332 dated Oct. 10, 2017 (12 pages).
Canada Application 2,909,804 Office Action dated Oct. 18, 2019, 4 pages.
A. Sand, Head-Mounted Display with Mid-Air Tactile Feedback, Proceedings of the 21st ACM Symposium on Virtual Reality Software and Technology, Nov. 13-15, 2015 (8 pages).

E. Bok, Metasurface for Water-to-Air Sound Transmission, Physical Review Letters 120, 044302 (2018) (6 pages).
K. Jia, Dynamic properties of micro-particles in ultrasonic transportation using phase-controlled standing waves, J. Applied Physics 116, n. 16 (2014) (12 pages).
Marco A B Andrade et al, "Matrix method for acoustic levitation simulation", IEEE Transactions on Ultrasonics, Ferroelectrics and Frequency Control, IEEE, US, (Aug. 1, 2011), vol. 58, No. 8, ISSN 0885-3010, pp. 1674-1683.
M. Barmatz et al, "Acoustic radiation potential on a sphere in plane, cylindrical, and spherical standing wave fields", The Journal of the Acoustical Society of America, New York, NY, US, (Mar. 1, 1985), vol. 77, No. 3, pp. 928-945, XP055389249.
M. Toda, New Type of Matching Layer for Air-Coupled Ultrasonic Transducers, IEEE Transactions on Ultrasonics, Ferroelecthcs, and Frequency Control, vol. 49, No. 7, Jul. 2002 (8 pages).
Search Report for PCT/GB/2017/053729 dated Mar. 15, 2018 (16 pages).
Search Report for PCT/GB/2017/053880 dated Mar. 21, 2018. (13 pages).
Xin Cheng et al, "Computation of the acoustic radiation force on a sphere based on the 3-D FDTD method", Piezoelectricity, Acoustic Waves and Device Applications (SPAWDA), 2010 Symposium on, IEEE, (Dec. 10, 2010), ISBN 978-1-4244-9822-2, pp. 236-239.
Yang Ling et al, "Phase-coded approach for controllable generation of acoustical vortices", Journal of Applied Physics, American Institute of Physics, US, vol. 113, No. 15, ISSN 0021-8979, (Apr. 21, 2013), pp. 154904-154904.
International Preliminary Report on Patentability and Written Opinion issued in corresponding PCT/US2017/035009, dated Dec. 4, 2018, 8 pages.
"Welcome to Project Soli" video, https://atap.google.eom/#project-soli Accessed Nov. 30, 2018, 2 pages.
Colgan, A., "How Does the Leap Motion Controller Work?" Leap Motion, Aug. 9, 2014, 10 pages.
Corrected Notice of Allowability dated Jun. 21, 2019 for U.S. Appl. No. 15/966,213 (2 pages).
Damn Geeky, "Virtual projection keyboard technology with haptic feedback on palm of your hand," May 30, 2013, 4 pages.
Definition of "Interferometry" according to Wikipedia, 25 pages., Retrieved Nov. 2018.
Definition of "Multilateration" according to Wikipedia, 7 pages., Retrieved Nov. 2018.
Definition of "Trilateration" according to Wikipedia, 2 pages., Retrieved Nov. 2018.
EPO Office Action for EP16708440.9 dated Sep. 12, 2018 (7 pages).
Ex Parte Quayle Action dated Dec. 28, 2018 for U.S. Appl. No. 15/966,213 (pp. 1-7).
Gokturk, et al., "A Time-of-Flight Depth Sensor-System Description, Issues and Solutions," Published in: 2004 Conference on Computer Vision and Pattern Recognition Workshop, Date of Conference: Jun. 27-Jul. 2, 2004, 9 pages.
Iddan, et al., "3D Imaging in the Studio (And Elsewhwere . . . " Apr. 2001, 3DV systems Ltd., Yokneam, Isreal, www.3dvsystems.com.il, 9 pages.
International Preliminary Report on Patentability for Application No. PCT/EP2017/069569 dated Feb. 5, 2019, 11 pages.
International Search Report and Written Opinion for Application No. PCT/GB2018/053739, dated Jun. 4, 2019, 16 pages.
Japanese Office Action (with English language translation) for Application No. 2017-514569, dated Mar. 31, 3019, 10 pages.
Kolb, et al., "Time-of-Flight Cameras in Computer Graphics," Computer Graphics forum, vol. 29 (2010), No. 1, pp. 141-159.
Krim, et al., "Two Decades of Array Signal Processing Research—The Parametric Approach", IEEE Signal Processing Magazine, Jul. 1996, pp. 67-94.
Lang, Robert, "3D Time-of-Flight Distance Measurement with Custom Solid-State Image Sensors in CMOS/CCD—Technology", A dissertation submitted to Department of EE and CS at Univ. of Siegen, dated Jun. 28, 2000, 223 pages.
Li, Larry, "Time-of-Flight Camera—An Introduction," Texas Instruments, Technical White Paper, SLOA190B—Jan. 2014 Revised May 2014, 10 pages.

(56) References Cited

OTHER PUBLICATIONS

Meijster, A., et al., "A General Algorithm for Computing Distance Transforms in Linear Time," Mathematical Morphology and its Applications to Image and Signal Processing, 2002, pp. 331-340.
Notice of Allowance dated Dec. 19, 2018 for U.S. Appl. No. 15/665,629 (pp. 1-9).
Notice of Allowance dated Dec. 21, 2018 for U.S. Appl. No. 15/983,864 (pp. 1-7).
Notice of Allowance dated Feb. 7, 2019 for U.S. Appl. No. 15/851,214 (pp. 1-7).
Notice of Allowance dated Jul. 31, 2019 for U.S. Appl. No. 15/851,214 (pp. 1-9).
Notice of Allowance dated Jul. 31, 2019 for U.S. Appl. No. 16/296,127 (pp. 1-9).
Notice of Allowance dated May 30, 2019 for U.S. Appl. No. 15/966,213 (pp. 1-9).
Office Action dated Apr. 18, 2019 for U.S. Appl. No. 16/296,127 (pags 1-6).
Office Action dated Apr. 4, 2019 for U.S. Appl. No. 15/897,804 (pp. 1-10).
Office Action dated Feb. 20, 2019 for U.S. Appl. No. 15/623,516 (pp. 1-8).
Office Action dated Jul. 10, 2019 for U.S. Appl. No. 15/210,661 (pp. 1-12).
Office Action dated Jul. 26, 2019 for U.S. Appl. No. 16/159,695 (pp. 1-8).
Office Action dated May 16, 2019 for U.S. Appl. No. 15/396,851 (pp. 1-7).
PCT Partial International Search Report for Application No. PCT/GB2018/053404 dated Feb. 25, 2019, 13 pages.
Péter Tamás Kovács et al, "Tangible Holographic 3D Objects with Virtual Touch", Interactive Tabletops & Surfaces, ACM, 2 Penn Plaza, Suite 701 New York NY 10121-0701 USA, (Nov. 15, 2015), ISBN 978-1-4503-3899-8, pp. 319-324.
Schmidt, Ralph, "Multiple Emitter Location and Signal Parameter Estimation" IEEE Transactions of Antenna and Propagation, vol. AP-34, No. 3, Mar. 1986, pp. 276-280.
Search report for PCT/GB2018/051061 dated Sep. 26, 2018 (17 pages).
Search report for PCT/US2018/028966 dated Jul. 13, 2018 (43 pages).
Sixth Sense webpage, http://www.pranavmistry.com/projects/sixthsense/ Accessed Nov. 30, 2018, 7 pages.
Steve Guest et al., "Audiotactile interactions in roughness perception", Exp. Brain Res (2002) 146:161-171, DOI 10.1007/s00221-002-1164-z, Accepted: May 16, 2002/Published online: Jul. 26, 2002, Springer-Verlag 2002, (11 pages).
Takahashi Dean: "Ultrahaptics shows off sense of touch in virtual reality", Dec. 10, 2016 (Dec. 10, 2016), XP055556416, Retrieved from the Internet: URL: https://venturebeat.com/2016/12/10/ultrahaptics-shows-off-sense-of-touch-in-virt ual-reality/ [retrieved on Feb. 13, 2019] 4 pages.
Teixeira, et al., "A brief introduction to Microsoft's Kinect Sensor," Kinect, 26 pages., retrieved Nov. 2018.
Xu Hongyi et al, "6-DoF Haptic Rendering Using Continuous Collision Detection between Points and Signed Distance Fields", IEEE Transactions on Haptics, IEEE, USA, vol. 10, No. 2, ISSN 1939-1412, (Sep. 27, 2016), pp. 151-161, (Jun. 16, 2017).
Zeng, Wejun, "Microsoft Kinect Sensor and Its Effect," IEEE Multimedia, Apr.-Jun. 2012, 7 pages.
Office Action dated Aug. 22, 2019 for U.S. Appl. No. 16/160,862 (pp. 1-5).
International Search Report and Written Opinion for Application No. PCT/GB2019/050969, dated Jun. 13, 2019, 15 pages.
Extended European Search Report for Application No. EP19169929.7, dated Aug. 6, 2019, 7 pages.
Office Action dated Oct. 7, 2019 for U.S. Appl. No. 15/396,851 (pp. 1-9).
Office Action dated Oct. 17, 2019 for U.S. Appl. No. 15/897,804 (pp. 1-10).
Corrected Notice of Allowability dated Oct. 31, 2019 for U.S. Appl. No. 15/623,516 (pp. 1-2).
Office Action dated Oct. 31, 2019 for U.S. Appl. No. 15/671,107 (pp. 1-6).
Office Action dated Mar. 20, 2020 for U.S. Appl. No. 15/210,661 (pp. 1-10).
European Office Action for Application No. EP16750992.6, dated Oct. 2, 2019, 3 pages.
Office Action dated Dec. 11, 2019 for U.S. Appl. No. 15/959,266 (pp. 1-15).
Jager et al., "Air-Coupled 40-KHZ Ultrasonic 2D-Phased Array Based on a 3D-Printed Waveguide Structure", 2017 IEEE, 4 pages.
Wooh et al., "Optimum beam steering of linear phased arays," Wave Motion 29 (1999) pp. 245-265, 21 pages.
Notice of Allowance dated Feb. 10, 2020, for U.S. Appl. No. 16/160,862 (pp. 1-9).
Office Action dated Feb. 25, 2020 for U.S. Appl. No. 15/960,113 (pp. 1-7).
Office Action dated Feb. 7, 2020 for U.S. Appl. No. 16/159,695 (pp. 1-8).
Office Action dated Jan. 29, 2020 for U.S. Appl. No. 16/198,959 (p. 1-6).
Office Action dated Jan. 10, 2020 for U.S. Appl. No. 16/228,767 (pp. 1-6).
Yaroslav Ganin et al., Domain-Adversarial Training of Neural Networks, Journal of Machine Learning Research 17 (2016) 1-35, submitted May 2015; published Apr. 2016.
Yaroslav Ganin et al., Unsupervised Domain Adaptataion by Backpropagation, Skolkovo Institute of Science and Technology (Skoltech), Moscow Region, Russia, Proceedings of the 32nd International Conference on Machine Learning, Lille, France, 2015, JMLR: W&CP vol. 37, copyright 2015 by the author(s), 11 pages.
Ashish Shrivastava et al., Learning from Simulated and Unsupervised Images through Adversarial Training, Jul. 19, 2017, pp. 1-16.
Konstantinos Bousmalis et al., Domain Separation Networks, 29th Conference on Neural Information Processing Sysgtems (NIPS 2016), Barcelona, Spain. Aug. 22, 2016, pp. 1-15.
Eric Tzeng et al., Adversarial Discriminative Domain Adaptation, Feb. 17, 2017, pp. 1-10.
David Joseph Tan et al., Fits like a Glove: Rapid and Reliable Hand Shape Personalization, 2016 IEEE Conference on Computer Vision and Pattern Recognition, pp. 5610-5619.
Jonathan Taylor et al., Efficient and Precise Interactive Hand Tracking Through Joint, Continuous Optimization of Pose and Correspondences, Siggraph '16 Technical Paper, Jul. 24-28, 2016, Anaheim, CA, ISBN: 978-1-4503-4279-87/16/07, pp. 1-12.
Toby Sharp et al., Accurate, Robust, and Flexible Real-time Hand Tracking, CHI '15, Apr. 18-23, 2015, Seoul, Republic of Korea, ACM 978-1-4503-3145-06/15/04, pp. 1-10.
Jonathan Taylor et al., Articulated Distance Fields for Ultra-Fast Tracking of Hands Interacting, ACM Transactions on Graphics, vol. 36, No. 4, Article 244, Publication Date: Nov. 2017, pp. 1-12.
GitHub—IntelRealSense/hand_tracking_samples: researc codebase for depth-based hand pose estimation using dynamics based tracking and CNNs, Mar. 26, 2020, 3 pages.
Stan Melax et al., Dynamics Based 3D Skeletal Hand Tracking, May 22, 2017, pp. 1-8.
Yarin Gal et al., Dropout as a Bayesian Approximation: Representing Model Uncertainty in Deep Learning, Oct. 4, 2016, pp. 1-12, Proceedings of the 33rd International Conference on Machine Learning, New York, NY, USA, 2016, JMLR: W&CP vol. 48.
Kaiming He et al., Deep Residual Learning for Image Recognition, http://image-net.org/challenges/LSVRC/2015/ and http://mscoco.org/dataset/#detections-challenge2015, Dec. 10, 2015, pp. 1-12.
Sergey Ioffe et al., Batch Normalization: Accelerating Deep Network Training by Reducing Internal Covariat Shift, Mar. 2, 2015, pp. 1-11.
Diederik P. Kingma et al., Adam: A Method for Stochastic Optimization, Jan. 30, 2017, pp. 1-15.
Christoper M. Bishop, Pattern Recognition and Machine Learning, pp. 1-758.
Markus Oberweger et al., DeepPrior++: Improving Fast and Accurate 3D Hand Pose Estimation, Aug. 28, 2017, pp. 1-10.

(56) References Cited

OTHER PUBLICATIONS

Markus Oberweger et al., Hands Deep in Deep Learning for Hand Pose Estimation, Dec. 2, 2016, pp. 1-10.
Mahdi Rad et al., Feature Mapping for Learning Fast and Accurate 3D Pose Inference from Synthetic Images, Mar. 26, 2018, pp. 1-14.
Jonathan Tompson et al., Real-Time Continuous Pose Recovery of Human Hands Using Convolutional Networks, ACM Trans. Graph. 33, 5, Article 169, pp. 1-10.
Vincent Lepetit et al., Model Based Augmentation and Testing of an Annotated Hand Pose Dataset, ResearchGate, https://www.researchgate.net/publication/307910344, Sep. 2016, 13 pages.
Shome Subhra Das, Detectioin of Self Intersection in Synthetic Hand Pose Generators, 2017 Fifteenth IAPR International Conference on Machine Vision Applications (MVA), Nagoya University, Nagoya, Japan, May 8-12, 2017, pp. 354-357.
Marin, About LibHand, LibHand—A Hand Articulation Library, www.libhand.org/index.html, Mar. 26, 2020, pp. 1-2; www.libhand.org/download.html, 1 page; www.libhand.org/examples.html, pp. 1-2.
GitHub—danfis/libccd: Library for collision detection between two convex shapes, Mar. 26, 2020, pp. 1-6.
OGRECave/ogre—GitHub: ogre/Samples/Media/materials at 7de80a7483f20b50f2b10d7ac6de9d9c6c87d364, Mar. 26, 2020, 1 page.
Shanxin Yuan et al., BigHand2.2M Bechmark: Hand Pose Dataset and State of the Art Analysis, Dec. 9, 2017, pp. 1-9.
Office Action dated Apr. 8, 2020, for U.S. Appl. No. 16/198,959 (pp. 1-17).
Office Action dated Apr. 16, 2020 for U.S. Appl. No. 15/839,184 (pp. 1-8).
Notice of Allowance dated Apr. 22, 2020 for U.S. Appl. No. 15/671,107 (pp. 1-5).
Office Action dated Apr. 17, 2020 for U.S. Appl. No. 16/401,148 (pp. 1-15).
Office Action dated Apr. 28, 2020 for U.S. Appl. No. 15/396,851 (pp. 1-12).
Office Action dated Apr. 29, 2020 for U.S. Appl. No. 16/374,301 (pp. 1-18).
Nina Gaissert, Christian Wallraven, and Heinrich H. Bulthoff, "Visual and Haptic Perceptual Spaces Show High Similarity in Humans", published to Journal of Vision in 2010, available at http://www.journalofvision.org/content/10/11/2 and retrieved on Apr. 22, 2020 (Year: 2010), 20 pages.
Hua J, Qin H., Haptics-based dynamic implicit solid modeling, IEEE Trans Vis Comput Graph. Sep.-Oct. 2004;10(5):574-86.
Hilleges et al. Interactions in the air: adding further depth to interactive tabletops, UIST '09: Proceedings of the 22nd annual ACM symposium on User interface software and technologyOct. 2009 pp. 139-148.
International Search Report and Written Opinion for Application No. PCT/GB2019/051223, dated Aug. 8, 2019, 15 pages.
Partial International Search Report for Application No. PCT/GB2018/053735, dated Apr. 12, 2019, 14 pages.
International Search Report and Written Opinion for Application No. PCT/GB2018/053738, dated Apr. 11, 2019, 14 pages.
Sean Gustafson et al., "Imaginary Phone", Proceedings of the 24th Annual ACM Symposium on User Interface Software and Techology: Oct. 16-19, 2011, Santa Barbara, CA, USA, ACM, New York, NY, Oct. 16, 2011, pp. 283-292, XP058006125, DOI: 10.1145/2047196.2047233, ISBN: 978-1-4503-0716-1.
Office Action dated May 18, 2020 for U.S. Appl. No. 15/960,113 (pp. 1-21).
Optimal regularisation for acoustic source reconstruction by inverse methods, Y. Kim, P.A. Nelson, Institute of Sound and Vibration Research, University of Southampton, Southampton, SO17 1BJ, UK; 25 pages.
Takahashi et al., "Noncontact Tactile Display Based on Radiation Pressure of Airborne Ultrasound" IEEE Transactions on Haptics vol. 3, No. 3 p. 165 (2010).
International Search Report and Written Opinion for Application No. PCT/GB2019/052510, dated Jan. 14, 2020, 25 pages.
Partial ISR for Application No. PCT/GB2020/050013 dated May 19, 2020 (16 pages).
Search report for PCT/GB2015/052507 dated Mar. 11, 2020 (19 pages).
Search report for PCT/GB2015/052916 dated Feb. 26, 2020 (18 pages).
Notice of Allowance in U.S. Appl. No. 15/210,661 dated Jun. 17, 2020 (22 pages).
Notice of Allowance dated Jun. 17, 2020 for U.S. Appl. No. 15/210,661 (pp. 1-9).
Office Action dated Dec. 7, 2020 for U.S. Appl. No. 16/563,608 (pp. 1-8).
Corrected Notice of Allowability dated Jan. 14, 2021 for U.S. Appl. No. 15/897,804 (pp. 1-2).
Office Action dated Mar. 11, 2021 for U.S. Appl. No. 16/228,767 (pp. 1-23).
Aoki et al., Sound location of stero reproduction with parametric loudspeakers, Applied Acoustics 73 (2012) 1289-1295 (7 pages).
Search Report by EPO for EP 17748466 dated Jan. 13, 2021 (16 pages).
Wang et al., Device-Free Gesture Tracking Using Acoustic Signals, ACM MobiCom '16, pp. 82-94 (13 pages).
ISR and WO for PCT/GB2020/052829 (dated Feb. 1, 2021) (15 pages).
Bortoff et al., Pseudolinearization of the Acrobot using Spline Functions, IEEE Proceedings of the 31st Conference on Decision and Control, Sep. 10, 1992 (6 pages).
ISR and WO for PCT/GB2020/052545 (dated Jan. 27, 2021) (14 pages).
ISR and WO for PCT/GB2020/052544 (dated Dec. 18, 2020) (14 pages).
Bajard et al., Evaluation of Complex Elementary Functions / A New Version of BKM, SPIE Conference on Advanced Signal Processing, Jul. 1999 (8 pages).
Bajard et al., BKM: A New Hardware Algorithm for Complex Elementary Functions, 8092 IEEE Transactions on Computers 43 (1994) (9 pages).
Office Action dated Mar. 31, 2021 for U.S. Appl. No. 16/228,760 (pp. 1-21).
ISR & WO for PCT/GB2020/052545 (dated Jan. 27, 2021) 14 pages.
Notice of Allowance dated Apr. 20, 2021 for U.S. Appl. No. 16/563,608 (pp. 1-5).
Hoshi et al.,Tactile Presentation by Airborne Ultrasonic Oscillator Array, Proceedings of Robotics and Mechatronics Lecture 2009, Japan Society of Mechanical Engineers; May 24, 2009 (5 pages).
Office Action dated May 14, 2021 for U.S. Appl. No. 16/198,959 (pp. 1-6).
Office Action dated May 13, 2021 for U.S. Appl. No. 16/600,500 (pp. 1-9).
ISR for PCT/GB2020/053373 (dated Mar. 26, 2021) (16 pages).
ISR for PCT/GB2020/052546 (dated Feb. 23, 2021) (14 pages).
Brian Kappus and Ben Long, Spatiotemporal Modulation for Mid-Air Haptic Feedback from an Ultrasonic Phased Array, ICSV25, Hiroshima, Jul. 8-12, 2018, 6 pages.
Notice of Allowance dated Jun. 10, 2021 for U.S. Appl. No. 17/092,333 (pp. 1-9).
Notice of Allowance dated Jun. 25, 2021 for U.S. Appl. No. 15/396,851 (pp. 1-10).
Office Action dated Jun. 25, 2021 for U.S. Appl. No. 16/899,720 (pp. 1-5).
Office Action dated Jun. 19, 2020 for U.S. Appl. No. 16/699,629 (pp. 1-12).
Office Action dated Jun. 25, 2020 for U.S. Appl. No. 16/228,767 (pp. 1-27).
Office Action dated Jul. 9, 2020 for U.S. Appl. No. 16/228,760 (pp. 1-17).
ISR and WO for PCT/GB2020/050926 (dated Jun. 2, 2020) (16 pages).

(56) References Cited

OTHER PUBLICATIONS

Mueller, GANerated Hands for Real-Time 3D Hand Tracking from Monocular RGB, Eye in-Painting with Exemplar Generative Adverserial Networks, pp. 49-59 (Jun. 1, 2018).

Seungryul, Pushing the Envelope for RGB-based Dense 3D Hand Pose Estimation for RGB-based Desne 3D Hand Pose Estimation via Neural Rendering, arXiv:1904.04196v2 [cs.CV] Apr. 9, 2019 (5 pages).

ISR and WO for PCT/GB2020/050013 (dated Jul. 13, 2020) (20 pages).

Bożena Smagowska & Małgorzata Pawlaczyk-Łuszczyńska (2013) Effects of Ultrasonic Noise on the Human Body—A Bibliographic Review, International Journal of Occupational Safety and Ergonomics, 19:2, 195-202.

Office Action dated Sep. 18, 2020 for U.S. Appl. No. 15/396,851 (pp. 1-14).

Office Action dated Sep. 21, 2020 for U.S. Appl. No. 16/198,959 (pp. 1-17).

Notice of Allowance dated Sep. 30, 2020 for U.S. Appl. No. 16/401,148 (pp. 1-10).

Notice of Allowance dated Oct. 1, 2020 for U.S. Appl. No. 15/897,804 (pp. 1-9).

Notice of Allowance dated Oct. 6, 2020 for U.S. Appl. No. 16/699,629 (pp. 1-8).

Notice of Allowance dated Oct. 16, 2020 for U.S. Appl. No. 16/159,695 (pp. 1-7).

Notice of Allowance dated Oct. 30, 2020 for U.S. Appl. No. 15/839,184 (pp. 1-9).

Georgiou et al., Haptic In-Vehicle Gesture Controls, Adjunct Proceedings of the 9th International ACM Conference on Automotive User Interfaces and Interactive Vehicular Applications (AutomotiveUI '17), Sep. 24-27, 2017 (6 pages).

Large et al.,Feel the noise: Mid-air ultrasound haptics as a novel human-vehicle interaction paradigm, Applied Ergonomics (2019) (10 pages).

Rocchesso et al.,Accessing and Selecting Menu Items by In-Air Touch, ACM CHItaly'19, Sep. 23-25, 2019, Padova, Italy (9 pages).

Shakeri, G., Williamson, J. H. and Brewster, S. (2018) May the Force Be with You: Ultrasound Haptic Feedback for Mid-Air Gesture Interaction in Cars. In: 10th International ACM Conference on Automotive User Interfaces and Interactive Vehicular Applications (AutomotiveUI 2018) (11 pages).

Imaginary Phone: Learning Imaginary Interfaces by Transferring Spatial Memory From a Familiar Device Sean Gustafson, Christian Holz and Patrick Baudisch. UIST 2011. (10 pages).

A. B. Vallbo, Receptive field characteristics of tactile units with myelinated afferents in hairy skin of human subjects, Journal of Physiology (1995), 483.3, pp. 783-795.

Amanda Zimmerman, The gentle touch receptors of mammalian skin, Science, Nov. 21, 2014, vol. 346 Issue 6212, p. 950.

Corrected Notice of Allowability dated Aug. 9, 2021 for U.S. Appl. No. 15/396,851 (pp. 1-6).

Henrik Bruus, Acoustofluidics 2: Perturbation theory and ultrasound resonance modes, Lab Chip, 2012, 12, 20-28.

Hyunjae Gil, Whiskers: Exploring the Use of Ultrasonic Haptic Cues on the Face, CHI 2018, Apr. 21-26, 2018, Montreal, QC, Canada.

India Morrison, The skin as a social organ, Exp Brain Res (2010) 204:305-314.

JonasChatel-Goldman, Touch increases autonomic coupling between romantic partners, Frontiers in Behavioral Neuroscience Mar. 2014, vol. 8, Article 95.

Kai Tsumoto, Presentation of Tactile Pleasantness Using Airborne Ultrasound, 2021 IEEE World Haptics Conference (WHC) Jul. 6-9, 2021. Montreal, Canada.

Keisuke Hasegawa, Electronically steerable ultrasound-driven long narrow airstream, Applied Physics Letters 111, 064104 (2017).

Keisuke Hasegawa, Midair Ultrasound Fragrance Rendering, IEEE Transactions on Visualization and Computer Graphics, vol. 24, No. 4, Apr. 2018 1477.

Keisuke Hasegawa,,Curved acceleration path of ultrasound-driven airflow, J. Appl. Phys. 125, 054902 (2019).

Line S Loken, Coding of pleasant touch by unmyelinated afferents in humans, Nature Neuroscience vol. 12 [ No. 5 [ May 2009 547.

Mariana von Mohr, The soothing function of touch: affective touch reduces feelings of social exclusion, Scientific Reports, 7: 13516, Oct. 18, 2017.

Mitsuru Nakajima, Remotely Displaying Cooling Sensation via Ultrasound-Driven Air Flow, Haptics Symposium 2018, San Francisco, USA p. 340.

Mohamed Yacine Tsalamlal, Affective Communication through Air Jet Stimulation: Evidence from Event-Related Potentials, International Journal of Human-Computer Interaction 2018.

Notice of Allowance dated Jul. 22, 2021 for U.S. Appl. No. 16/600,500 (pp. 1-9).

Office Action dated Aug. 10, 2021 for U.S. Appl. No. 16/564,016 (pp. 1-14).

Office Action dated Aug. 19, 2021 for U.S. Appl. No. 17/170,841 (pp. 1-9).

Office Action dated Aug. 9, 2021 for U.S. Appl. No. 17/068,825 (pp. 1-9).

Office Action dated Sep. 24, 2021 for U.S. Appl. No. 17/080,840 (pp. 1-9).

Rochelle Ackerley, Human C-Tactile Afferents Are Tuned to the Temperature of a Skin-Stroking Caress, J. Neurosci., Feb. 19, 2014, 34(8):2879-2883.

Ryoko Takahashi, Tactile Stimulation by Repetitive Lateral Movement of Midair Ultrasound Focus, Journal of Latex Class Files, vol. 14, No. 8, Aug. 2015.

Stanley J. Bolanowski, Hairy Skin: Psychophysical Channels and Their Physiological Substrates, Somatosensory and Motor Research, vol. 11. No. 3, 1994, pp. 279-290.

Stefan G. Lechner, Hairy Sensation, Physiology 28: 142-150, 2013.

Supplemental Notice of Allowability dated Jul. 28, 2021 for U.S. Appl. No. 16/563,608 (pp. 1-2).

Supplemental Notice of Allowability dated Jul. 28, 2021 for U.S. Appl. No. 17/092,333 (pp. 1-2).

Takaaki Kamigaki, Noncontact Thermal and Vibrotactile Display Using Focused Airborne Ultrasound, EuroHaptics 2020, LNCS 12272, pp. 271-278, 2020.

Tomoo Kamakura, Acoustic streaming induced in focused Gaussian beams, J. Acoust. Soc. Am. 97 (5), Pt. 1, May 1995 p. 2740.

Uta Sailer, How Sensory and Affective Attributes Describe Touch Targeting C-Tactile Fibers, Experimental Psychology (2020), 67(4), 224-236.

Anonymous: "How does Ultrahaptics technology work?— Ultrahaptics Developer Information", Jul. 31, 2018 (Jul. 31, 2018), XP055839320, Retrieved from the Internet: URL:https://developer.ultrahaptics.com/knowledgebase/haptics-overview/ [retrieved on Sep. 8, 2021].

Corrected Notice of Allowability dated Nov. 24, 2021 for U.S. Appl. No. 16/600,500 (pp. 1-5).

EPO 21186570.4 Extended Search Report dated Oct. 29, 2021.

EPO Application 18 725 358.8 Examination Report dated Sep. 22, 2021.

EPO Examination Search Report 17 702 910.5 (dated Jun. 23, 2021).

International Search Report and Written Opinion for App. No. PCT/GB2021/051590, dated Nov. 11, 2021, 20 pages.

Notice of Allowance dated Nov. 5, 2021 for U.S. Appl. No. 16/899,720 (pp. 1-9).

Office Action (Non-Final Rejection) dated Dec. 20, 2021 for U.S. Appl. No. 17/195,795 (pp. 1-7).

Office Action (Notice of Allowance and Fees Due (PTOL-85)) dated Dec. 14, 2021 for U.S. Appl. No. 17/170,841 (pp. 1-8).

Office Action dated Oct. 29, 2021 for U.S. Appl. No. 16/198,959 (pp. 1-7).

* cited by examiner

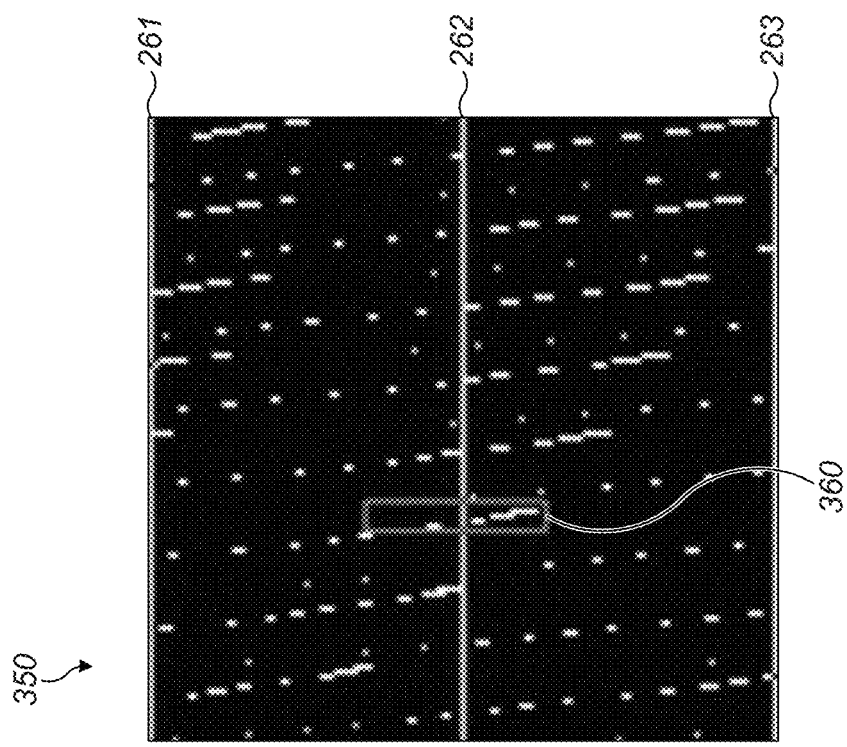
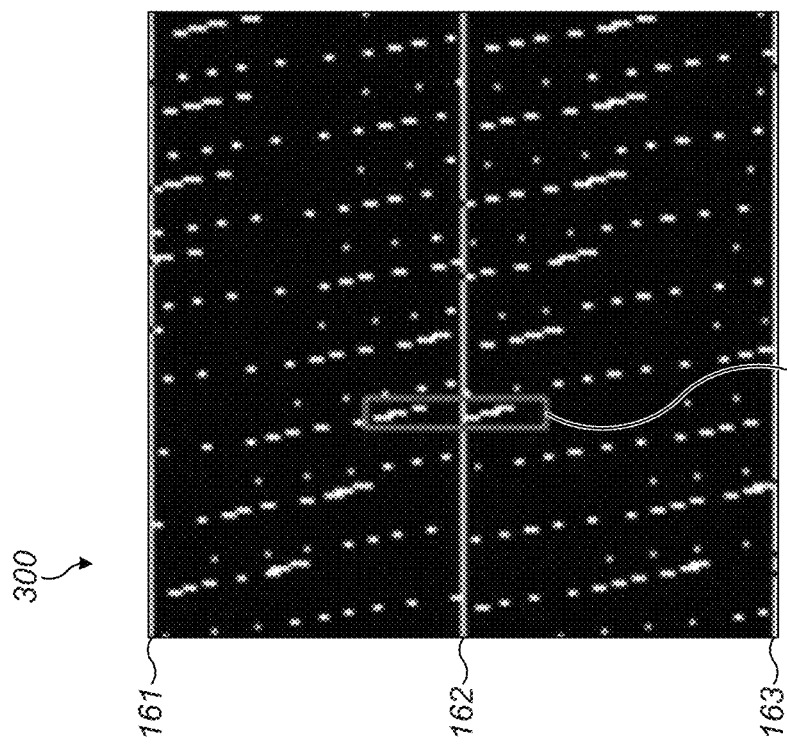

VARIABLE PHASE AND FREQUENCY PULSE-WIDTH MODULATION TECHNIQUE

RELATED APPLICATION

This application claims the benefit of U.S. Provisional Patent Application No. 62/744,656, filed on Oct. 12, 2018, which is incorporated by reference in its entirety.

FIELD OF THE DISCLOSURE

The present disclosure relates generally to reconstructing digital signals by specified amplitude and phase via inducing frequency shifts away from a base frequency implied by phase changes.

BACKGROUND

Phased array systems rely on the production of an exact carrier frequency to function. To simplify systems, it is often assumed that the carrier frequency is emitted during all relevant times so that the system can be treated as time invariant. This time invariance is necessary for the input signals to the array element transducers to be treated as complex values.

Generating a constant frequency pulse-width modulated (PWM) digital signal with a given phase offset for all relevant times is trivial. But changing the state of a phased array system often involves changing the phase angle of the elements, which violates the time-invariance requirement. This results in many side-effects, including a shift in frequency. Since the digital signal generation assumes that the base frequency (the frequency with which the primitive phase angles are specified relative to) is equal to the carrier frequency for all relevant times, this causes errors in the digital signals output to each array element transducer. Thus, it is necessary for the development of a signal generation system that is capable of producing a digital signal using the free selection of amplitude and phase. Thus is used to produce a substantially error-free signal that preserves the amplitude and phase relative to a constant base frequency while allowing the carrier frequency to vary.

SUMMARY

The solution presented herein uses the specified amplitude and phase to reconstruct a digital signal that explicitly induces the frequency shifts away from the base frequency implied by phase changes. Shifting the carrier frequency of a digitally controlled phased array while preserving the timing of the individual phase pulses enables more efficient driving of the phased array system when the phase of the drive signals change dynamically in time.

BRIEF DESCRIPTION OF THE DRAWINGS

The accompanying figures, where like reference numerals refer to identical or functionally similar elements throughout the separate views, together with the detailed description below, are incorporated in and form part of the specification, serve to further illustrate embodiments of concepts that include the claimed invention and explain various principles and advantages of those embodiments.

FIGS. 3A and 3B are closeups of FIGS. 1 and 2, respectively.

Figure 1:
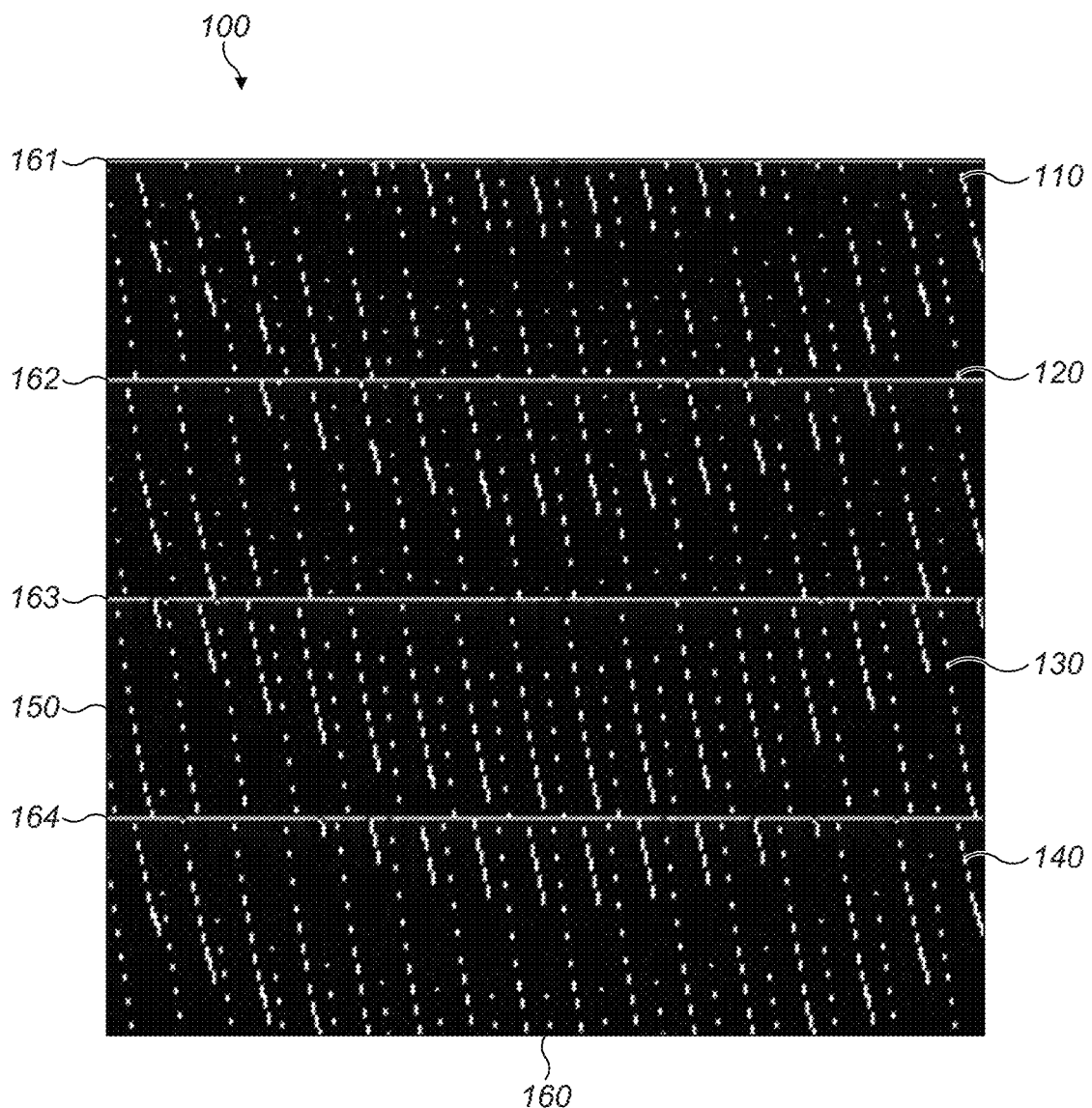
FIG. 1 shows an output from a quickly-moving focus point using a standard approach.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Carrier frequency is defined herein as the consequential instantaneous frequency of the output digital signal pulses. Base frequency is defined herein as the center frequency that is described by an unmoving or constant phase signal. It is known that any phase change in the signal also constitutes a frequency shift. In this case that is realized by the carrier frequency shifting away from the base frequency. To preserve compatibility with the input intended for the elements of a phased array, the input data to the method is considered to be the phase and duty cycle of a pulse-width modulation. This is measured with respect to a steady reference signal that is a fixed source at the base frequency.

I. SHIFTING CARRIER FREQUENCIES WHILE PRESERVING TIME AND PHASE ACCURACY

Prior solutions suppose a set carrier frequency (that is always equal to the base frequency) where any variation from this frequency (including any change in phase) generates error. If the true carrier frequency is close to the base frequency this error is small, but it is still consistently present when (for instance) moving the focus of the phased array.

FIG. 1 shows an output from a quickly-moving focus point using a standard approach. The drive of each transducer in a square 16×16 element phased array is represented by a column of black and white data. Horizontal gray bars represent the start of each period of the base frequency and the rows are each tick of the clock on which a binary digit that describes the transducer state must be output. Each square of black or white data describes the binary state of the electrical input signal and thus transducer element at that tick through time. Each carrier frequency period is generated independently at the base frequency with the correct phase and duty cycle that corresponds to the amplitude.

Specifically, FIG. 1 is a visualization 100 of the digital pulse-width modulated output from the standard technique when the focus for the array is moving quickly. The input to each transducer is arranged horizontally 160, with time 150 moving from the bottom to the top of the diagram. The base frequency periods are delineated 161, 162, 163, 164, showing where one period ends and the next begins. Erroneously repeating pulses 110, 120, 130, 140 can be seen that are indicative of a frequency shift from the base frequency, here to a lower carrier frequency. The standard technique requires that each base frequency period contains at least one pulse region 110, 120, 130, 140. But it can be seen that the correct behavior should involve fewer than one pulse region per base frequency period, showing that the system is attempting to generate a frequency lower than the base frequency. This can be appreciated by the curving trend of the pulses required to affect a focus in the phased array. The trend of these pulses formed by the focusing process have erroneous discontinuities at the edges of each period. This trend can be identified as seeming to have repeated discontinuous offsets in time in order to fulfil the implied requirement of having one pulse region per base frequency period.

Figure 2:
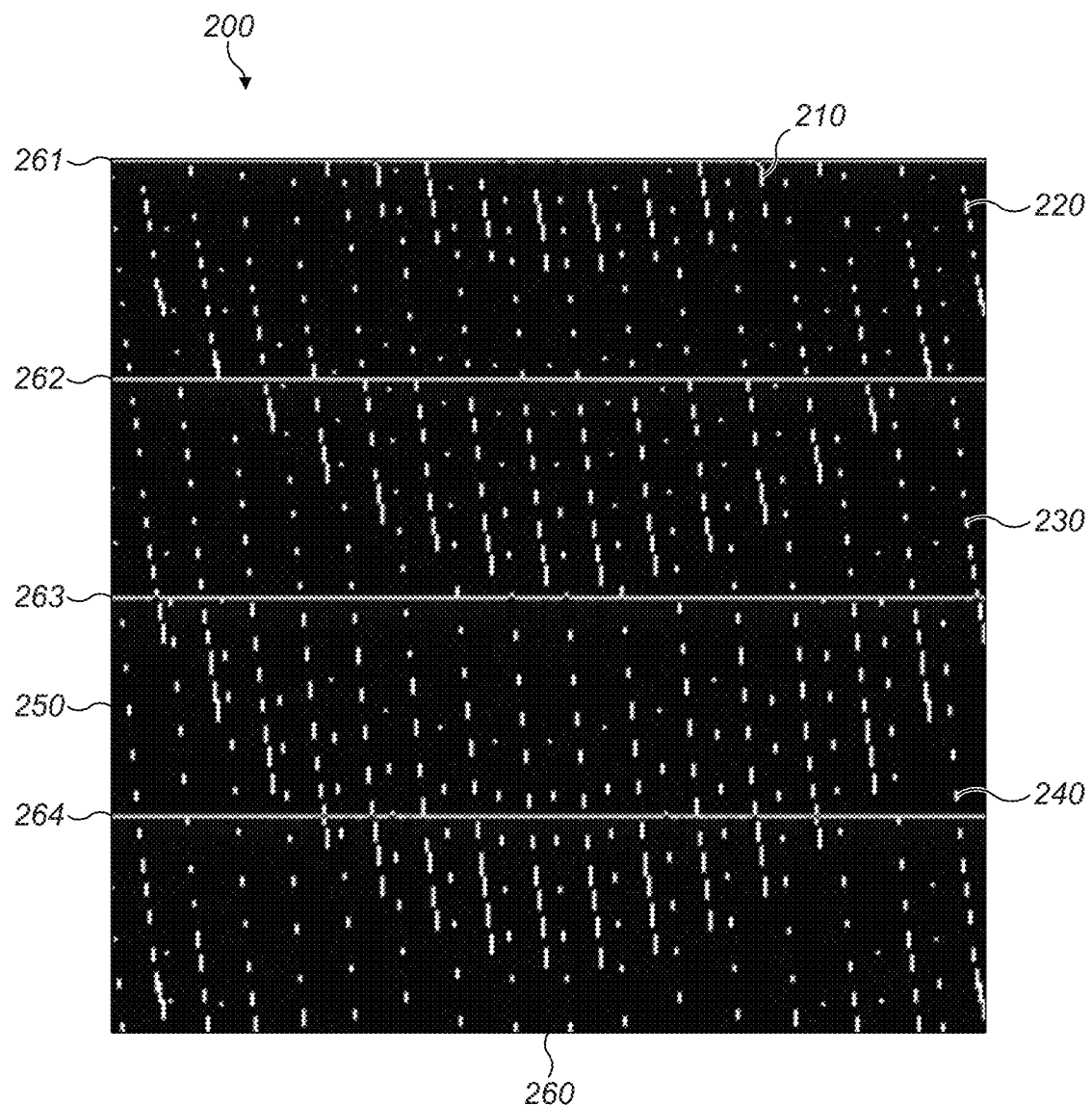
FIG. 2 shows an output similar to FIG. 1 but from a quickly-moving focus point using a novel approach.

The new algorithm, whose output is shown in FIG. 2, allows the carrier frequency to shift away from the base frequency while preserving the timing and phase accuracy of the amplitude generating pulses. Shown is a visualization 200 of the digital pulse-width modulated output from the new technique when the focus for the array is moving quickly. The input to each transducer is arranged horizontally 260, with time 250 moving from the bottom of the top of the diagram. The base frequency periods are delineated 261, 262, 263, 264, showing where one period ends and the next begins. Here the double pulses 210, 220, 230, 240 are no longer a problem. While the phases agree exactly with the standard approach at the start of each base frequency period, the number of pulse regions per base frequency period is now on average less than one. These features taken together show that the carrier frequency has been lowered correctly.

The detailed differences between the output from both approaches is shown in FIGS. 3A and 3B. FIG. 3A is a detail 300 of the upper left corner of FIG. 1. FIG. 3B is a detail 350 of the upper left corner of FIG. 2. As the waveform of both techniques are equivalent at the start of each base frequency period 162, 262 the pulse intended to be produced at the base frequency in the old technique (FIG. 3A), has instead produced a double pulse 310 due to the moving phase shift. The reality is that not only is the double pulse incorrect, its frequency content is disruptive to the behavior of the system. This is because the temporal distance between the two pulses implies very high frequency content that is near neither the base nor the intended carrier frequency.

In the new technique (FIG. 3B), a single pulse 360 has been produced at a lower frequency that corresponds to the corrected position across both base frequency periods (between 261 and 262 and between 262 and 263). The single pulse 360 further has been elongated in time to factor in the change in the number of discrete ticks that a given duty cycle percentage implies. This is shown by its occupation of more pulse elements (white squares) than the equivalent pulses in 310.

II. HARDWARE TECHNIQUES TO CREATE SUITABLE PWM OUTPUT

The hardware-efficient method of generating the up-sampling of the phase represented as the evaluation of high-order polynomial interpolant is also novel. The aim is to produce a PWM output that respects and correctly interprets changes in frequency while also preserving absolute phase and phase changes. Without loss of generality, this technique may be also restated with phase delays that produces a "sign flip" in angle from the technique described.

The moving phase angle may be considered as an equivalent formulations for a phase-frequency modulated wave:

$$\cos\left(\omega t + \int \frac{d\theta'(t)}{dt} dt + \theta\right) = \cos(\theta'(t) + \omega t) = \cos\left(\theta + \int \omega'(t) dt\right),$$

where $\theta'(t)$ is a time-dependent function of phase and $\Omega'(t)$ is a time-dependent function of frequency. It can be seen that $d\theta'(t)/dt$ is a measure of deviation of the carrier frequency from the base frequency. This can be simplified by normalizing both angle and $\omega$ (divide through by the base frequency and $2\pi$ radians, $\theta$ now being measured in revolutions), yielding $\omega=1$.

Describing the phase delay $\theta'(t)$ may be achieved by interpolating phase offsets generated in subsequent base frequency steps by a polynomial, since it is beneficial for the frequency to be defined and continuous on the endpoints. The frequency is defined as:

$$\frac{d\theta'(t)}{dt} + \omega = \omega'(t),$$

where the first time derivatives of phase angle also contribute to the instantaneous carrier frequency and thus form two derivative constraints:

$$\frac{d\theta'(0)}{dt} + \omega = \omega'(0) = \omega + \theta_0 - \theta_{-1},$$

$$\frac{d\theta'(1)}{dt} + \omega = \omega'(1) = \omega + \theta_1 - \theta_0.$$

The two endpoints of the interval in angle also have further constraints:

$$\theta'(0) = \theta_0,$$

$$\theta'(1) = \theta_1,$$

which together with the constraints on carrier frequency make four in total. This necessitates a cubic polynomial interpolation for this level of continuity. As shown, defining $\omega'(0)$ and $\omega'(1)$ can be achieved using backwards differences, thus limiting the number of samples required in the future direction and reducing latency. This also reduces the total number of immediately available samples required from four to three precomputed samples of the phase angle and duty cycle of the intended signal.

The cubic form of the interpolating spline polynomial formed from backwards differences is:

$$\theta'(t) = (-\theta_{-1} + 2\theta_0 - \theta_1)t^3 + (2\theta_{-1} - 4\theta_0 + 2\theta_1)t^2 + (\theta_0 - 1_{-1})t + \theta_0,$$

which is repeated for every interval.

Further, the phase may be also represented by a lower degree polynomial. Although this would imply sacrificing some of the continuity conditions, the reasonable approach is to produce discontinuities in frequency anyway (but importantly, phase continuity is preserved as only the time derivatives of the phase are discontinuous). Even with frequency discontinuities, the technique using this interpolant enjoys a significant accuracy improvement over the standard technique. The linear interpolant for such a method may be stated as:

$$\theta'(t)=(\theta_1-\theta_0)t+\theta_0.$$

Although the complexity of the implementation increases, higher order interpolation polynomials may equally be used without loss of generality. The on-time of a digital signal is described by the duty cycle, which is assumed proportional to the amplitude of the signal. This motivates the name "pulse-width modulation." This can be realized here by adding an interpolation on the duty cycle value Δ of the signal encoded as a pulse-width percentage at the base frequency:

$$\Delta'(t)=(\Delta_1-\Delta_0)t+\Delta_0.$$

Defining the output signal going into the element as a digital approximation to:

$$\cos\left(\omega t + \int \frac{d\theta'(t)}{dt}dt + \theta\right) = \cos(\theta'(t) + \omega t),$$

so a time-varying θ phase offset with respect to the base frequency may also be viewed as a deviation from the base signal frequency co, effectively dθ'(t)/dt. To search for the locations of the pulses, zeroes (also multiples of 2π) of the angle input to the cosine function must be found. These correspond to peaks in the wave and high points in the digital signal. To achieve this, both angle and ω are normalized (divide through by the frequency and 2π radians, all θ now being measured in revolutions), yielding ω=1. Therefore, the condition being searched for is:

$$\omega t-\theta'(t)=t-\theta'(t)=0.$$

This describes the center of the pulse at each step.

To find the extent of the pulse around the center point, the value |t−θ'(t)| is computed. If it is smaller than a given value representing an amplitude, then the point in time is within the pulse, in the high region of the digital signal. Otherwise, the point in time is outside the pulse and in the low region of the digital signal.

FIGS. 4 through 7 geometrically demonstrate how testing that this value is less than Δ'(t)/2 generates the appropriate pulse.

Figure 4:
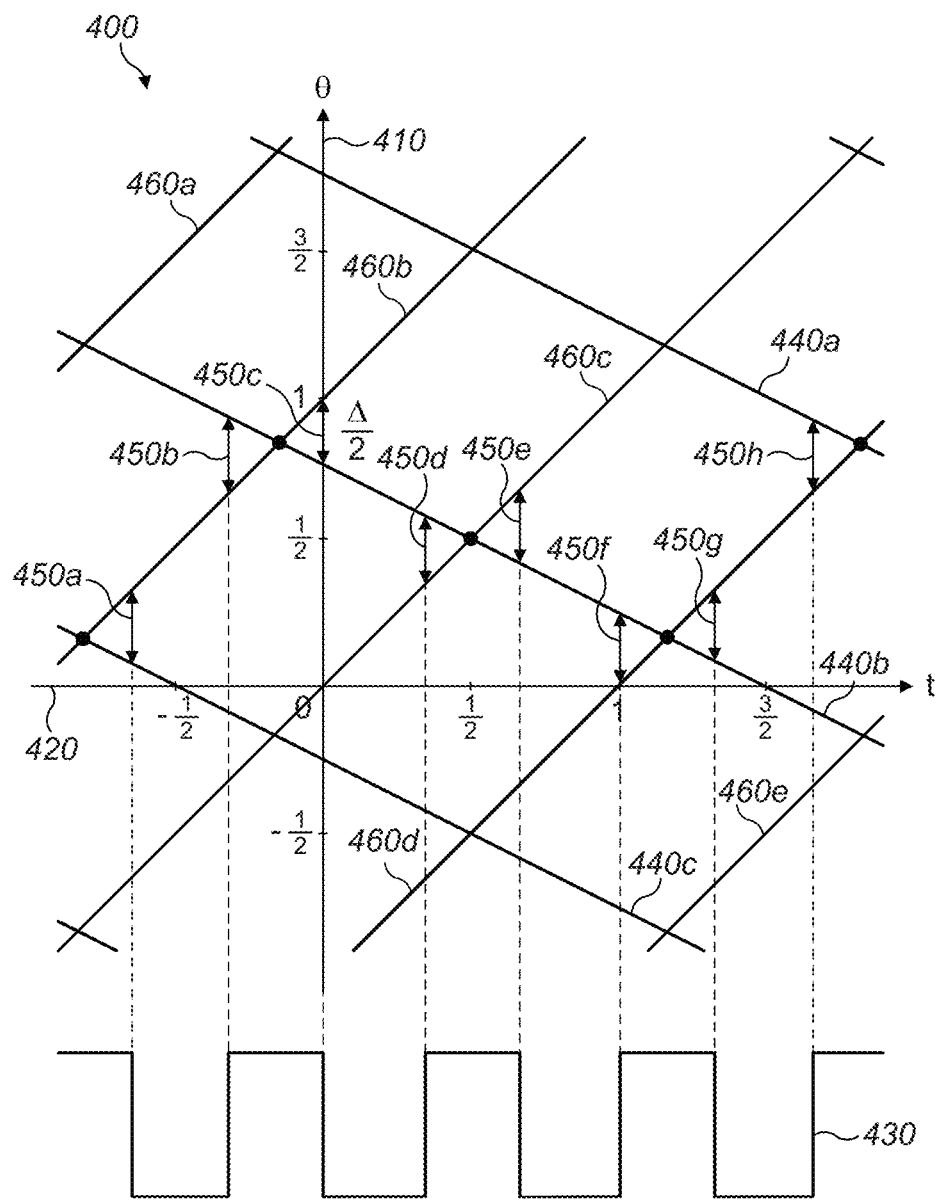
FIG. 4 shows geometric behavior of a system having 3/2 of a base frequency.

FIG. 4 shows the geometrical behavior 400 for the edge case of 3/2 of the base frequency. In this graph, Δ is Δ(t), the y-axis 410 represents normalized angle (in revolutions) θ, and the x-axis 420 represents normalized time (in base frequency periods) t. This FIG. 4 is a geometric interpretation of the PWM generation when applied to a slowly decreasing phase (with derivative −½, negative slope down and to the right), relative to the base frequency represented by the diagonal phase lines 440a, 440b, 440c.

The distance between the two sets of repeating curves crosses the threshold where it is less than Δ/2 (defined as half the duty cycle quantity) distance in a number of places 450a, 450b, 450c, 450d, 450e, 450f, 450g, 450h that repeat in time. These two sets of curves are the constant phase versus timelines 460a, 460b, 460c, 460d, 460e (θ=t or θ=ωt, but wrapped around in rotations and base frequency periods since ω is normalized to one). This travels up and to the right of the diagram that represent the base frequency with zero phase offset behavior. The interpolated phase curves (θ'(t)) that represent the desired behavior that are an addition to this signal in phase 440a, 440b, 440c. Where the two curves "match" in phase closely enough (less than Δ/2), these regions represent the pulse parts of the pulse signals 430. The dashed vertical lines projected from the Δ/2 distance factors 450a, 450b, 450c, 450d, 450e, 450f, 450g, 450h show the places on the PWM signal 430 where the binary state is changed inducing pulse edges due to the Δ/2 distance factor being reached.

The constant phase versus timelines (θ=t or θ=ωt) travelling up and to the right of the diagram that represent the base frequency with zero phase offset behavior are repeated for every period of the base frequency. The repetition in the vertical direction shows that it is true for all integer numbers of rotations in angle. Thus it is true even considering numerical wrap-around of the counters used to implement the method. This generates a PWM signal with a carrier frequency that is three-halves the base frequency (where the frequency multiplier is obtained by subtracting the instantaneous derivative of the interpolated phase lines θ'(t)(−½) from the derivative of the constant phase versus timelines θ=ωt(1), so 1−(−½)=3/2). At the bottom is the final digital signal 430 that is to drive the element made up of all of the points where the two sets of curves are less than Δ/2 distance apart.

Figure 5:
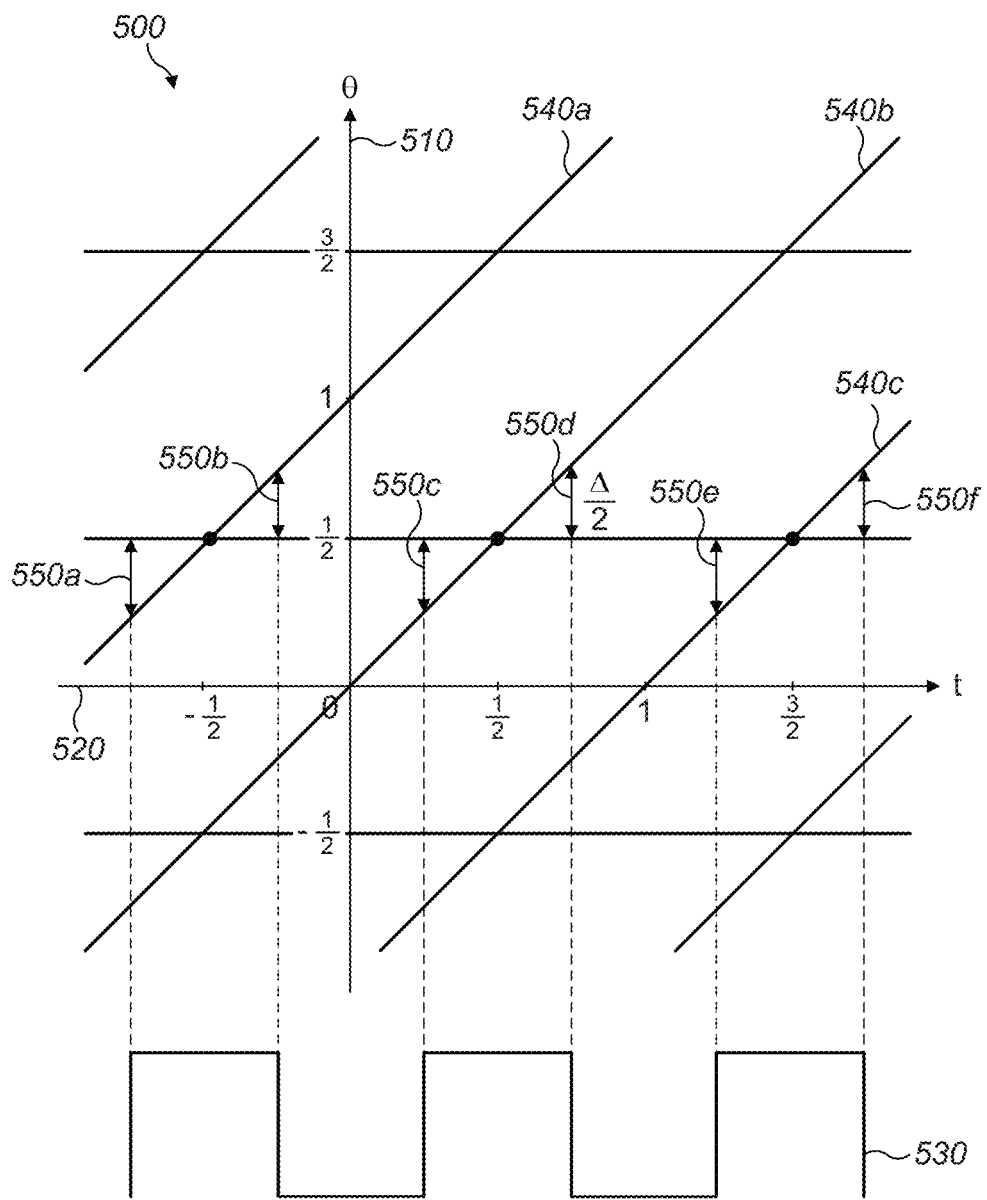
FIG. 5 shows geometric behavior of a system having exactly the base frequency.

FIG. 5 shows the geometrical behavior 500 for exactly the base frequency. In this graph, Δ is Δ(t), the y-axis 510 represents normalized angle (in revolutions) θ, and the x-axis 520 represents normalized time (in base frequency periods) t. Shown is a geometric interpretation of the PWM generation when applied to a flat constant phase angle θ'(t) (horizontal lines with derivative zero in time) that does not change relative to the base frequency represented by the diagonal phase lines 540a, 540b, 540c.

The distance Δ/2 550a, 550b, 550c, 550d, 550e, 550f again represents the transition points between the two states in the pulse signal. Thus, the two curves cross over exactly once per base frequency period because the interpolated phase curve is horizontal and represents a constant phase angle. This generates a PWM signal with a carrier frequency that that is exactly equal to the base frequency (where the frequency multiplier is again obtained by subtracting the instantaneous derivative of the interpolated phase lines θ'(t)(0) from the derivative of the constant phase versus timelines θ=ωt(1), so 1−0=1). The dashed lines show the pulse edges in the pulsed signal. At the bottom is the final digital signal 530 that is to drive the element made up of all of the points where the two sets of curves are again less than Δ/2 distance apart.

Figure 6:
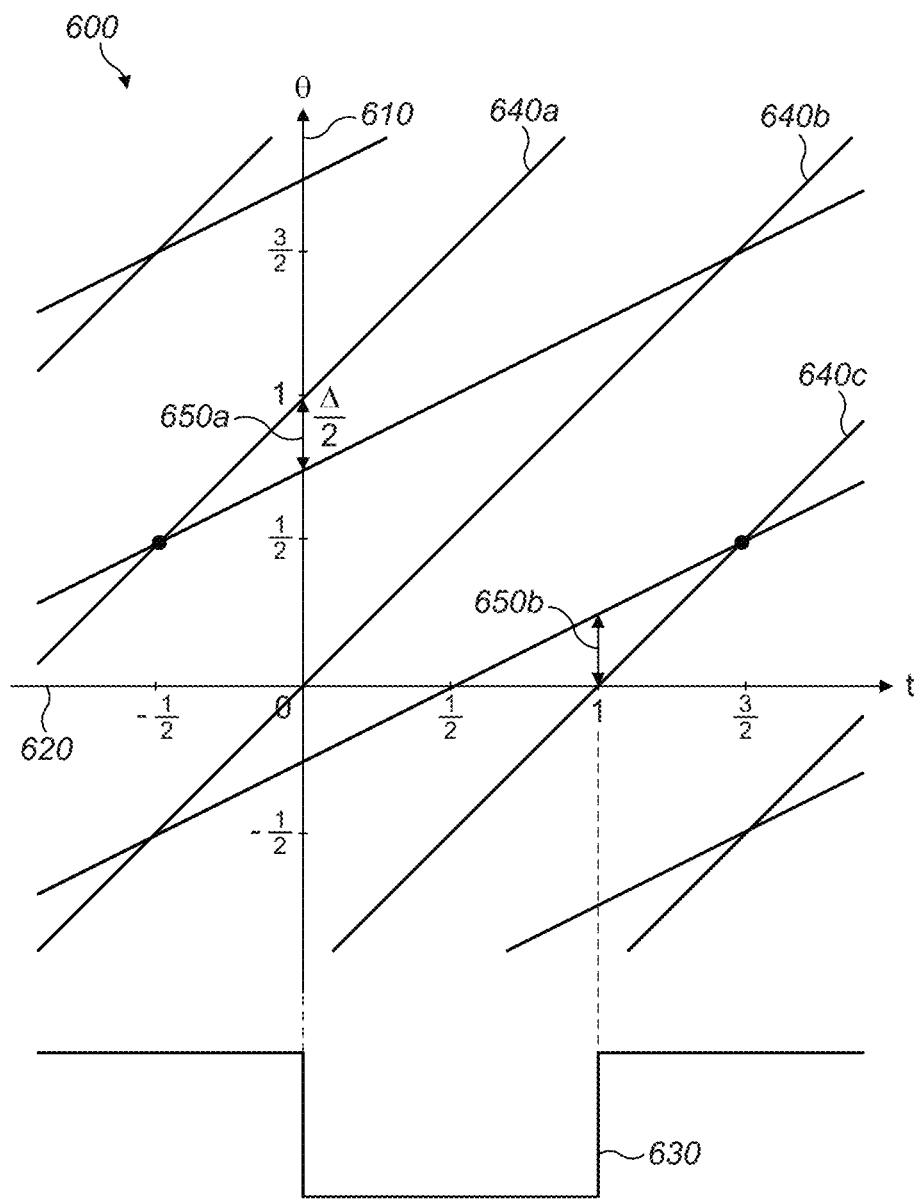
FIG. 6 shows geometric behavior of a system having a slowly increasing phase relative to the base frequency.

FIG. 6 shows the geometrical behavior 600 for the edge case of ½ the base frequency. In this graph, Δ is Δ(t), the y-axis 610 represents normalized angle (in revolutions) θ, and the x-axis 620 represents normalized time (in base frequency periods) t. The distance Δ/2 650a, 650b again represents the transition points between the two states in the pulse signal.

Shown is a geometric interpretation of the PWM generation when applied to an increasing phase θ'(t) (with derivative 2), relative to the base frequency represented by the diagonal phase lines 640a, 640b, 640c. This generates a PWM signal with a carrier frequency that is half the base frequency (where the frequency multiplier is obtained by subtracting the instantaneous derivative of the interpolated phase lines θ'(t)(+½) from the derivative of the constant phase versus time lines θ=ωt(1), so 1−(+½)=½). At the bottom is the final digital signal 630 that is to drive the element made up of all of the points where the two sets of curves are again less than Δ/2 distance apart.

Figure 7:
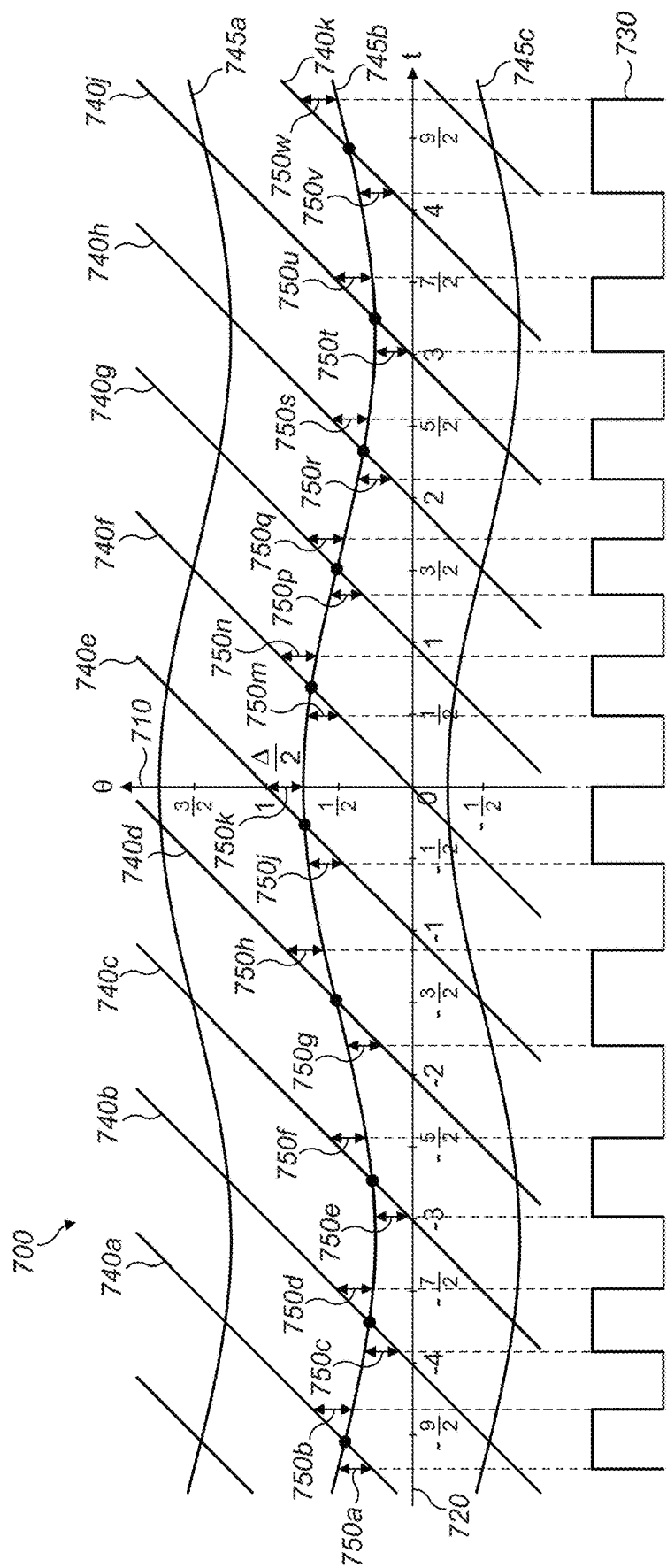
FIG. 7 shows geometric behavior of a system having an arbitrary function of phase angle relative to the base frequency.

FIG. 7 shows the geometrical behavior 700 as to how an example interpolated function where the gradient and thus frequency changes significantly over time fits into this geometric description. In this graph, Δ is Δ(t), the y-axis 710 represents normalized angle (in revolutions) θ, and the x-axis 720 represents normalized time (in base frequency periods) t. Shown is a geometric interpretation of the PWM generation when applied to a more arbitrarily defined function of phase angle, relative to the base frequency represented by the diagonal phase lines θ'(t) or θ=ωt 740a, 740b, 740c, 740d, 740e, 740f, 740g, 740h, 740j, 740k. The distance Δ/2 750a, 750b, 750c, 750d, 750e. 750f. 750g, 750h, 750j, 750k, 750m, 750n, 750p, 750q, 750r, 750s, 7501, 750u, 750v, 750w again represents the edges in the pulse signal. But here while they represent the same Δ/2 distance on the y-axis, they correspond to varying pulse length on the x-axis. The wavy horizontal lines 745a, 745b, 745c are the interpolated phase lines θ'(t) in this example.

The variation in the derivative of θ'(t) moves between positive derivative that generates longer pulses at a lower frequency and negative derivative that generates shorter pulses at a higher frequency. This is due to the crossings between y-axis distances smaller than Δ/2 and larger than Δ/2 changing their relative distance apart. At the bottom is the final digital signal 730 that is to drive the element, wherein pulse edges are induced when the signal y-axis distance crosses the Δ/2 threshold.

It can also be proven that the duty cycle value Δ'(t)/2 when used in this way scales appropriately with frequency for this scheme.

Figure 8:
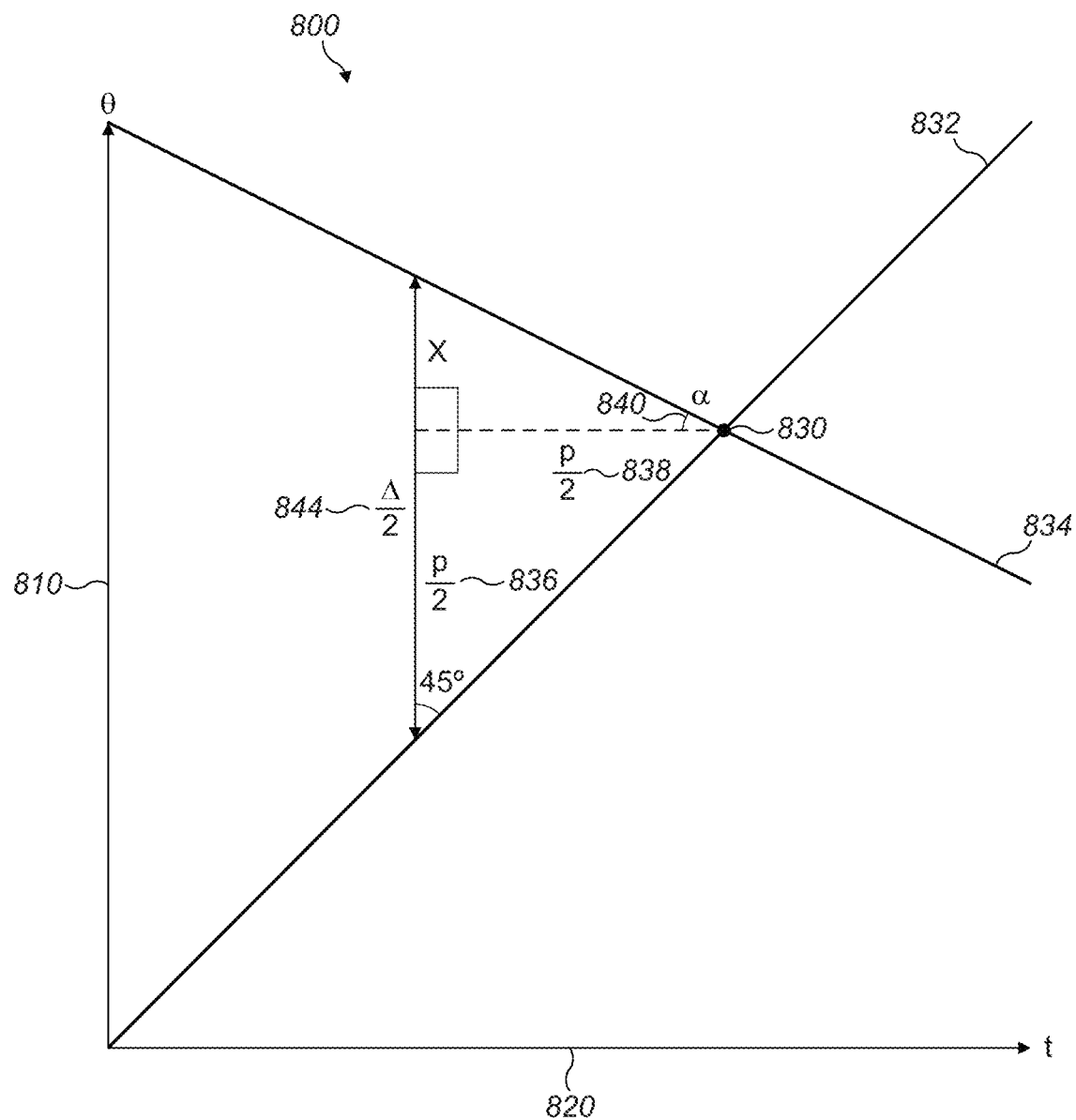
FIG. 8 shows geometric construction of proof of the correct behavior for the case of increased frequency.

FIG. 8 shows the geometric construction 800 of the proof of the correct behavior for the case of increased frequency. The y-axis 810 represents normalized angle (in revolutions) θ and the x-axis 820 represents normalized time (in base frequency periods) t. The distance Δ/2 844 again represents the state change in the transducer drive signal. But in this situation the curve θ'(t) is assumed to have negative derivative $$\frac{d\theta'(t)}{dt},$$

resulting in a higher frequency. The more negative the derivative $$\frac{d\theta'(t)}{dt},$$

the higher the frequency and the larger the distance X should be.

Further, FIG. 8 shows a geometric proof of the correct scaling of the amplitude of the pulses with frequency. This is a further effect of the measurement approach for carrier frequencies that have increased with respect to the base frequency. This is demonstrated by showing that p/2 836, 838, which is half the width of the final pulse, scales in time appropriately with the frequency shift. Further, a negatively sloped phase curve θ'(t) 834 that is of constant slope intersects 830 a positively sloped curve 832 θ=t. To find p/2 836, 838 (the length of half of the pulse at the new higher frequency) the angle α 840 can be found as:

$$\tan\alpha = \frac{x}{p/2} = \left|\frac{d\theta'(t)}{dt}\right|,$$

and since $$\frac{\Delta'(t)}{2} = \frac{p}{2} + x,$$

$$x = \frac{p}{2}\left|\frac{d\theta'(t)}{dt}\right|,$$

$$\frac{\Delta'(t)}{2} = \frac{p}{2} + \frac{p}{2}\left|\frac{d\theta'(t)}{dt}\right|,$$

$$\frac{\Delta'(t)}{2} = \frac{p}{2}\left(1 + \left|\frac{d\theta'(t)}{dt}\right|\right),$$

$$\frac{p}{2} = \frac{\Delta'(t)/2}{1 + \left|\frac{d\theta'(t)}{dt}\right|},$$

which is the definition of the appropriate pulse-width change due to the frequency shift when $$\frac{d\theta'(t)}{dt} \leq 0.$$

In summary, FIG. 8 demonstrates that the half pulse width is appropriately scaled in this situation for the frequency multiplier $$1 + \left|\frac{d\theta'(t)}{dt}\right|,$$

when the y-axis distance Δ/2 is used as the criterion for the pulse edges. This is exactly the frequency multiplier required.

Figure 9:
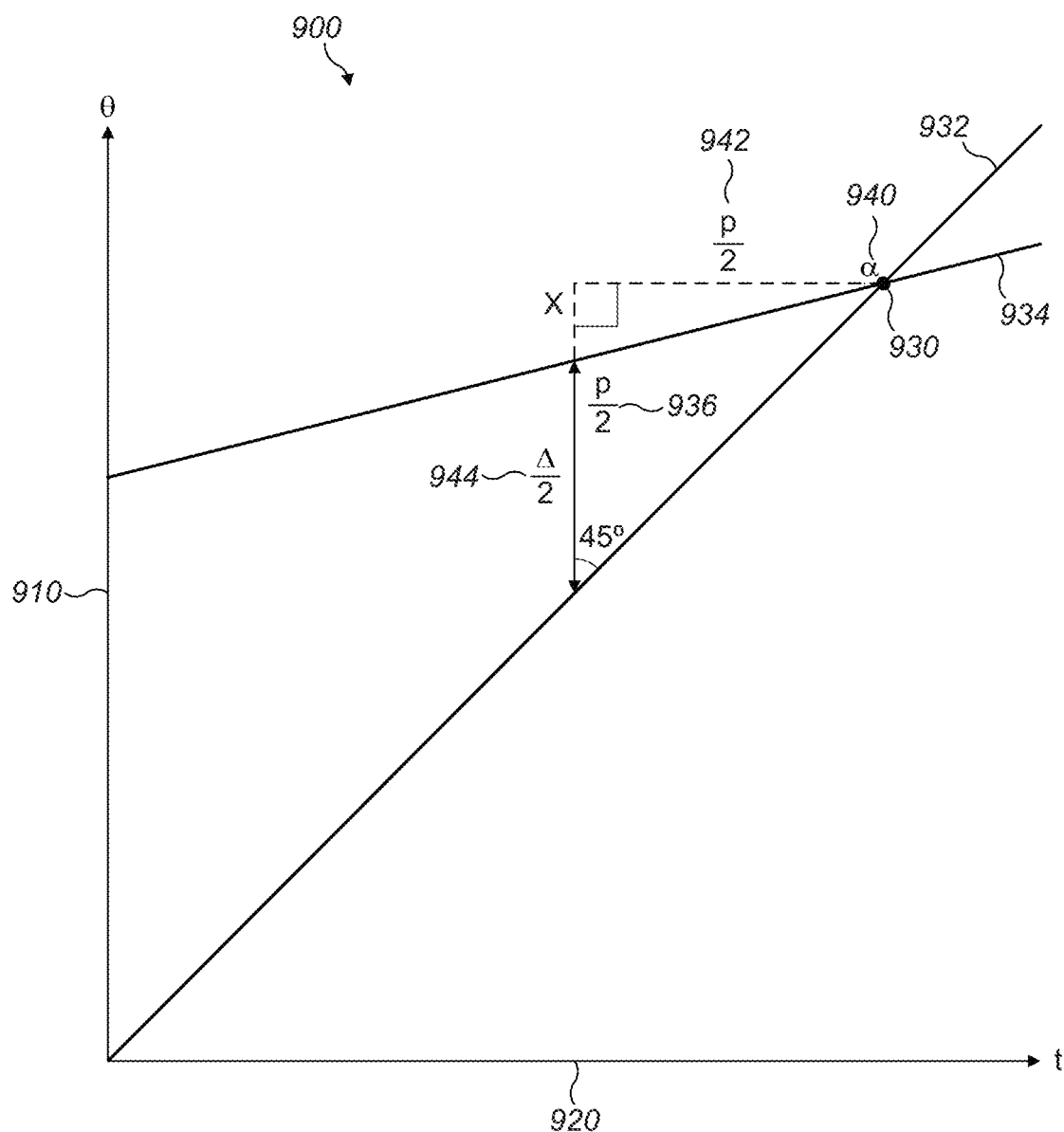
FIG. 9 shows geometric construction of proof of the correct behavior for the case of decreased frequency.

FIG. 9 shows the geometric construction 900 of the proof of the correct behavior for the case of decreased frequency. The y-axis 910 represents normalized angle (in revolutions) θ and the x-axis 920 represents normalized time (in base frequency periods) t. The distance Δ/2 944 again represents the state change in the transducer drive signal. But in this situation the curve θ'(t) is assumed to have positive derivative $$\frac{d\theta'(t)}{dt},$$

resulting in a lower frequency. The more positive the derivative $$\frac{d\theta'(t)}{dt},$$

the lower the frequency and the larger the distance X should be.

Further, shown is a geometric proof of the correct scaling of the amplitude of the pulses with frequency. This is a further effect of the measurement approach for carrier frequencies that have increased with respect to the base frequency. This is demonstrated by showing that p/2 936, 942 which is half the width of the final pulse, scales appropriately in time with the frequency shift.

Further, a positively sloped phase curve θ'(t) 934 that is of constant slope, intersects 930 a positively sloped curve θ=t 932. To find p/2 936, 942 (the length of half of the pulse at the new lower frequency) the angle α 940 can be found using a similar construction as before as:

$$\tan\alpha = \frac{x}{p/2} = \left|\frac{d\theta'(t)}{dt}\right|,$$

and since $$\frac{\Delta'(t)}{2} = \frac{p}{2} - x,$$

$$x = \frac{p}{2}\left|\frac{d\theta'(t)}{dt}\right|,$$

$$\frac{\Delta'(t)}{2} = \frac{p}{2} - \frac{p}{2}\left|\frac{d\theta'(t)}{dt}\right|,$$

$$\frac{\Delta'(t)}{2} = \frac{p}{2}\left(1 - \left|\frac{d\theta'(t)}{dt}\right|\right),$$

$$\frac{p}{2} = \frac{\Delta'(t)/2}{1 - \left|\frac{d\theta'(t)}{dt}\right|},$$

which is the definition of the appropriate pulse width change due to the frequency shift when $$\frac{d\theta'(t)}{dt} \ge 0.$$

In summary, FIG. 9 demonstrates that the half pulse width is appropriately scaled in this situation for the frequency multiplier $$1 - \left|\frac{d\theta'(t)}{dt}\right|,$$

when the y-axis distance Δ/2 is used as the criterion for the pulse edges. This is exactly the frequency multiplier required.

In conclusion, having shown that the Boolean test:

|t−θ'(t)|<Δ'(t)/2, is guaranteed to produce the best approximation of the pulse, it is imperative that the progressive evaluation of the polynomial interpolant be achieved with an efficient hardware algorithm.

III. COUNTER ARCHITECTURE

The uniformly progressive requirement for the evaluation of the spline interpolant affords an intuitive and low-cost approach to the evaluation of polynomial. By incrementing time forward, a series of cascaded counters may be used to derive simplex numbers and thus the powers of t required. For each carrier frequency period, t should range in the interval 0 to 1 to evaluate the spline polynomial.

Each spline interval counts k discrete sub-interval steps from 0 to $2^{INT\_BITS}-1$. By incrementing each counter, it can compute the terms corresponding to the powers of k. By reinterpreting powers of k as fractions, powers of t are computed. This occurs by first establishing a per spline-curve constant, for instance taking the constant b. Then, the first counter (proportional to b multiplied by a linear order term in t) is defined by:

$$\propto bO(t)_0 = 0,$$

$$\propto bO(t)_k = \propto bO(t)_{k-1} + b,$$

$$\propto bO(t)_k = bk = 2^{INT\_BITS} bt.$$

From this counter, it is clear that bit shifting the sum by INT_BITS immediately yields the first power of t multiplied by the increment bt. It should be noted that if only linear interpolants are required, they may be calculated through the application of this counter when initializing to the constant part of the interpolant. For instance, if bt+f were required:

$$\propto (f+bO(t))_0 = 2^{INT\_BITS} f,$$

$$\propto (f+bO(t))_k = \propto (f+bO(t))_{k-1} + b,$$

$$\propto (f+bO(t))_k = 2^{INT\_BITS} f + bk = 2^{INT\_BITS}(bt+f).$$

Continuing with the high-order interpolant, the next counter (proportional to b multiplied by a quadratic order term in t) is defined by the "triangular" numbers as:

$$\propto bO(t^2)_0 = 0,$$

$$\propto bO(t^2)_k = \propto bO(t^2)_{k-1} + \propto bO(t)_k,$$

$$\propto bO(t^2)_k = b\left(\frac{1}{2}k^2 + \frac{1}{2}k\right) = b\frac{k(k+1)}{2!},$$

$$2(\propto bO(t^2)_k) - (\propto bO(t)_k) = 2^{2 \times INT\_BITS} bt^2.$$

The linear part must be subtracted beforehand due to the difference in the power-of-two. This then yields the quadratic term in t, $bt^2$, when adjusted to represent a fraction.

The next counter (and the final one required for a cubic interpolant, which is proportional to b multiplied by a cubic order term in t) is defined by the "tetrahedral" numbers as:

$$\propto bO(t^3)_0 = 0,$$

$$\propto bO(t^3)_k = \propto bO(t^3)_{k-1} + \propto O(t^2)_k,$$

$$\propto bO(t^3)_k = b\left(\frac{1}{6}k^3 + \frac{1}{2}k^2 + \frac{1}{3}k\right) = b\frac{k(k+1)(k+2)}{3!},$$

$$6(\propto bO(t^3)_k - \propto bO(t^2)_k) + \propto bO(t) = 2^{3 \times INT\_BITS} bt^3,$$

In some embodiments in the expressions for higher powers of t, due to the differences in the power-of-two prefixed it may be possible to omit the corrections when the power of t of the error term and the power of t of the desired term are separated by some c orders of magnitude. This situation may incur acceptable levels of error for sufficiently large c. This can instead be described using the k−1$^{th}$ iteration to generate:

$$\propto bO(t^3)_{-1} = 0,$$

$$\propto bO(t^3)_{k-1} = b\left(\frac{1}{6}k^3 - \frac{1}{6}k\right) = b\frac{(k-1)k(k+1)}{3!},$$

$$6(\propto bO(t^3)_{k-1}) + \propto bO(t) = 2^{3 \times INT\_BITS}bt^3,$$

By combining these powers of t, potentially with different substituted b depending on the construction of the spline polynomial, simple counters may be used to generate splines consisting of arbitrarily high-order polynomials. The incremented counters serve to increment the time variable t forward, and in so doing, generate the next discrete time slice of the intended signal.

For instance, given the interpolating spline:

$$\theta'(t) = (-\theta_{-1} + 2\theta_0 - \theta_1)t^3 + (2\theta_{-1} - 4\theta_0 + 2\theta_1)t^2 + (\theta_0 - \theta_{-1})t + \theta_0,$$

and the duty cycle interpolant:

$$\Delta'(t) = (\Delta_1 - \Delta_0)t + \Delta_0,$$

the counters required are then:

$$A_{counter} := \propto (\Delta_0 + (\Delta_1 - \Delta_0)O(t)),$$

$$B_{counter} := \propto ((\theta_{-1} - 2\theta_0 + \theta_1)O(t)),$$

$$C_{counter} := \propto ((\theta_{-1} - 2\theta_0 + \theta_1)O(t^2)),$$

$$D_{counter} := \propto ((\theta_{-1} - 2\theta_0 + \theta_1)O(t^3)),$$

$$E_{counter} := \propto ((\theta_0 + (\theta_0 - \theta_{-1})O(t)).$$

To assemble Δ'(t) (the duty cycle to achieve the required output power at the base frequency) and θ'(t) (the instantaneous phase offset with respect to the base frequency) these may be combined as:

$$\Delta'(t) = \Delta_0 + (\Delta_1 - \Delta_0)t = \frac{A_{counter}}{2^{INT\_BITS}},$$

$$(\theta_0 - \theta_{-1})t + \theta_0 = \frac{E_{counter}}{2^{INT_{BITS}}},$$

$$(2\theta_{-1} - 4\theta_0 + 2\theta_1)t^2 = \frac{4C_{counter} - 2B_{counter}}{2^{2 \times INT_{BITS}}},$$

$$(-\theta_{-1} + 2\theta_0 - \theta_1)t^3 \approx \frac{6D_{counter}}{2^{3 \times INT_{BITS}}},$$

which are trivially added together and subtracted to produce the Boolean condition that drives the output signal.

IV. LOW BANDWIDTH OPERATION VERSUS LARGE FREQUENCY BANDWIDTH

It should also be noted that due to the power-of-two behaviors of the counter architecture, this may be applied to phase and amplitude samples spaced by power-of-two counts of the base frequency period and not just splitting the base frequency period into $2^{INT\_BITS}$ discrete steps. This could be used in some embodiments to provide a lower bandwidth interface, both in data usage and in frequency range about the base frequency that are addressable. In a similar vein, the phase and amplitude samples may be increased in some embodiments to have a power-of-two samples in every base frequency period to provide additional frequency bandwidth about the carrier instead.

To achieve lower data rate at the cost of reduced frequency bandwidth about the base frequency, the spline interpolant interval must be made to cover a power-of-two count of base frequency periods. This may involve increasing the number of bits of precision produced by the interpolant or decreasing the number of bits of precision of the timer counter, so that $2^{INT-BITS}$ spans multiple periods. Each are addressable by the most significant bits of INT_BITS. Further, multiple progressions of the wrapped-around θ=t line must be supported in the spline interval in this mode of operation, making the de facto spline interval $0 \leq t < 2^N$. This decreases the accessible range of frequencies, since the maximum angular movement of the additional phase, a radians, is now spread across $2^N$ base frequency periods. This reduces the maximum possible frequency shift.

To achieve increased frequency bandwidth about the base frequency at the expense of increased data rate, the spline interpolant interval must be reduced to cover only a power-of-two with a negative exponent (fractional) part of the base frequency period. This may involve decreasing the number of bits of precision produced by the interpolant or increasing the number of bits of precision of the timer counter. The addition of these extra data points effectively makes the spline interval $0 \leq t < 2^{-N}$. This increases the accessible range of frequencies as the maximum angular movement of the additional phase, a radians, is now confined to $2^{-N}$ fraction of base frequency period. This increases the maximum possible frequency shift achievable.

V. ENVIRONMENTAL COMPENSATION

With traditional techniques such as frequency multipliers, dividers and phased locked loops (PLLs), it is difficult to make small or dynamic changes to the carrier frequency. As the dynamic control of a phased array requires exact phase information this implies that a digital approach, if the hardware is sufficiently capable, will be more suitable than an analog solution for prescribing precise behavior. Thus, its behavior is deterministic, easy to model and predictable compared to a system which uses analog infrastructure to achieve this level of synchronization due to delays and instabilities among other problems. As the system explicitly evaluates the phase function, the transducer impulse response can be predicted and taken into account by modeling the frequency content of the output signal. Further, with the technique described herein, by adding an accumulator onto the phase angle input into the signal generator described produces a frequency shift that may be easily controlled without affecting the relative phases in an unknown way. In the case of environmental changes, it may be that the frequency requires such small changes to keep the wavelength constant. The remainder of the system may then continue to work in units of wavelength with the guarantee that this is compensated for by the driving system at the end of the pipeline. The accumulator that adds onto the phase for all of the transducers is incremented or decremented using a value that is derived from one or more sensors, such as (for example) temperature, humidity and altitude/density sensors.

VI. FURTHER DESCRIPTION

The following paragraphs provide further description of the invention.

1. A system comprising a digital or analog electrical signal driven by a real-time progressive polynomial spline evaluation that achieves an up-sampling by a power-of-two factor using a linear combination of counters.

2. A system comprising a digital or analog electrical signal whose instantaneous phase angle is substantially calculated by a real-time progressive polynomial spline evaluation that achieves an up-sampling by a power-of-two factor using a linear combination of counters.

3. A system comprising a digital electrical signal whose state is calculated by comparing the difference between the current position in the base frequency cycle and the instantaneous phase angle to the proportion of cycle duty that would be present at the base frequency.

4. The system of claims 1, 2 or 3 where the polynomial spline interval is a base frequency period.

5. The system of claims 1, 2 or 3 where the polynomial spline interval is a power-of-two count of base frequency periods.

6. The system of claims 1, 2 or 3 where the polynomial spline interval is a power-of-two fraction of the base frequency period.

7. The system of claims 1-6 where the phase angle is modified by a rolling counter incremented by a value driven by external sensors monitoring the environment.

8. The system of claims 1-6 where the phase angle is modified by a rolling counter decremented by a value driven by external sensors monitoring the environment.

VII. CONCLUSION

While the foregoing descriptions disclose specific values, any other specific values may be used to achieve similar results. Further, the various features of the foregoing embodiments may be selected and combined to produce numerous variations of improved haptic systems.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art. The term "coupled" as used herein is defined as connected, although not necessarily directly and not necessarily mechanically. A device or structure that is "configured" in a certain way is configured in at least that way but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

We claim:

1. A system comprising:
   an output of an electrical signal that is controlled by an interpolation of a polynomial spline evaluated over uniformly spaced samples in real-time;
   wherein, within the interpolation, a term of an nth power of an independent variable at an mth timestep within an interval is inferred using identities for an mth n-dimensional triangular number and all mth triangular numbers in lower numbers of dimensions whose values correspond to those producible using recursively defined counters;
   wherein a rearrangement rearranges identities into a polynomial that is progressively evaluated using an integer combinations of recursive counters given by the rearrangement;
   wherein at least one of the recursive counters is incremented on each timestep by a sample value that is to be interpolated;
   wherein the interpolation results in an up-sampling of a function described by values of the uniformly-spaced samples, and increasing a number of the uniformly spaced samples of the function by a power-of-two.

2. The system of claim 1, wherein the polynomial spline has a plurality of intervals, and wherein at least one of the plurality of intervals is a base frequency period.

3. The system of claim 1, wherein the polynomial spline has a plurality of intervals, and wherein at least one of the plurality of intervals is a power-of-two count of base frequency periods.

4. The system of claim 1, wherein the polynomial spline has a plurality of intervals, and wherein at least one of the plurality of intervals is a power-of-two fraction of a base frequency period.

5. The system of claim 1, wherein the electrical signal has a phase angle, and wherein the phase angle is modified by a rolling counter incremented by a value driven by an external environmental monitoring sensor.

6. The system of claim 1, wherein the electrical signal has a phase angle, and wherein the phase angle is modified by a rolling counter decremented by a value driven by an external environmental monitoring sensor.

7. A system comprising:

an electrical signal, wherein an instantaneous phase angle of the electrical signal is substantially calculated by a real-time progressive evaluation of a polynomial spline;

wherein, within the evaluation, a term of an nth power of an independent variable at an mth timestep within an interval is inferred using identities for an mth n-dimensional triangular number and all mth triangular numbers in lower numbers of dimensions whose values correspond to those producible using recursively defined counters;

wherein a rearrangement rearranges identities into a polynomial that is progressively evaluated using an integer combinations of recursive counters given by the rearrangement;

wherein at least one of the recursive counters is incremented on each timestep by a sample value that is to be interpolated;

wherein the evaluation results in an up-sampling of a function described by values of uniformly-spaced samples, and increasing a number of the uniformly spaced samples of the function by a power-of-two.

8. The system of claim 7, wherein the polynomial spline has a plurality of intervals, and wherein at least one of the plurality of intervals is a base frequency period.

9. The system of claim 7, wherein the polynomial spline has a plurality of intervals, and wherein at least one of the plurality of intervals is a power-of-two count of base frequency periods.

10. The system of claim 7, wherein the polynomial spline has a plurality of intervals, and wherein at least one of the plurality of intervals is a power-of-two fraction of a base frequency period.

11. The system of claim 7, wherein the electrical signal has a phase angle, and wherein the phase angle is modified by a rolling counter incremented by a value driven by an external environmental monitoring sensor.

12. The system of claim 7, wherein the electrical signal has a phase angle, and wherein the phase angle is modified by a rolling counter decremented by a value driven by an external environmental monitoring sensor.

* * * * *